(12) United States Patent
Lee et al.

(10) Patent No.: US 11,171,311 B2
(45) Date of Patent: Nov. 9, 2021

(54) DISPLAY DEVICE

(71) Applicant: LG Display Co., Ltd., Seoul (KR)

(72) Inventors: Young-Wook Lee, Goyang-si (KR); Seon-Hui Hwang, Paju-si (KR); Eun-Young Park, Pohang-si (KR); Yong-Su An, Anyang-si (KR); Woo-Chan Cho, Paju-si (KR); Sun-Mi Lee, Paju-si (KR); Jong-Han Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/706,402

(22) Filed: Dec. 6, 2019

(65) Prior Publication Data

US 2020/0194721 A1    Jun. 18, 2020

(30) Foreign Application Priority Data

Dec. 14, 2018 (KR) .................. 10-2018-0161834

(51) Int. Cl.
| | |
|---|---|
| *H01L 51/52* | (2006.01) |
| *H01L 27/32* | (2006.01) |
| *G06F 3/041* | (2006.01) |
| *G06F 3/042* | (2006.01) |

(52) U.S. Cl.
CPC ........ *H01L 51/5253* (2013.01); *G06F 3/0412* (2013.01); *G06F 3/0425* (2013.01); *H01L 27/323* (2013.01); *H01L 27/3234* (2013.01); *H01L 27/3246* (2013.01); *H01L 51/5246* (2013.01); *H01L 51/5284* (2013.01); *G06F 2203/04107* (2013.01)

(58) Field of Classification Search
None
See application file for complete search history.

(56) References Cited

U.S. PATENT DOCUMENTS

| | | | | |
|---|---|---|---|---|
| 2018/0166507 | A1* | 6/2018 | Hwang | .......... G06F 3/041 |
| 2019/0173053 | A1* | 6/2019 | Choi | .......... G04B 19/04 |
| 2020/0135800 | A1* | 4/2020 | Seo | .......... H01L 27/3276 |
| 2020/0144341 | A1* | 5/2020 | Choi | .......... H01L 51/0096 |
| 2020/0159369 | A1* | 5/2020 | Seo | .......... H01L 27/3276 |

* cited by examiner

*Primary Examiner* — Stephen T. Reed
(74) *Attorney, Agent, or Firm* — Fenwick & West LLP

(57) ABSTRACT

A display device capable of reducing a non-display area includes a substrate hole surrounded by light emitting elements, and a moisture penetration preventing layer disposed between an inner dam surrounded by the light emitting elements and the substrate hole. Accordingly, it is possible to prevent damage to light emitting stacks caused by external moisture or oxygen. Since the substrate hole is disposed within an active area, a reduction in non-display area is achieved.

16 Claims, 26 Drawing Sheets

DISPLAY DEVICE

CROSS-REFERENCE TO RELATED APPLICATIONS

This application claims the benefit of Republic of Korea Patent Application No. 10-2018-0161834 filed on Dec. 14, 2018, which is hereby incorporated by reference as if fully set forth herein.

BACKGROUND

Field

The present disclosure relates to a display device, and more particularly to a display device capable of reducing a non-display area.

Discussion of the Related Art

An image display device, which renders a variety of information on a screen, is a core technology of the information age. Such an image display device is developing towards enhanced thinness, enhanced lightness, and enhanced portability as well as enhanced performance. In connection with this, a flat display device capable of eliminating disadvantages of heavy and bulky structures of cathode ray tubes (CRTs) is highlighted.

Representative examples of such a flat display device may include a liquid crystal display (LCD) device, a plasma display panel (PDP), an organic light emitting display (OLED) device, an electrophoretic display (ED) device, and the like.

Such a flat display device is employed in various types of appliances such as a television (TV), a monitor and a portable phone, and is being further advanced through addition of a camera, a speaker and a sensor thereto. However, the camera, the speaker, the sensor and the like are disposed in a non-display area of the display device and, as such, a bezel area, which is a non-display area, increases. For this reason, there may be a limitation in maximizing a display area in the display device.

SUMMARY

Accordingly, the present disclosure is directed to a display device that substantially obviates one or more problems due to limitations and disadvantages of the related art.

An object of the present invention is to provide a display device capable of reducing a non-display area.

Additional advantages, objects, and features of the invention will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device includes a substrate hole surrounded by light emitting elements, and a moisture penetration preventing layer disposed between an inner dam surrounded by the light emitting elements and the substrate hole. Accordingly, it may be possible to prevent damage to light emitting stacks caused by external moisture or oxygen. Since the substrate hole is disposed within an active area, a reduction in non-display area may be achieved.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the disclosure.

DETAILED DESCRIPTION

Hereinafter, preferred embodiments of the present disclosure will be described in detail with reference to the accompanying drawings.

Figure 1:
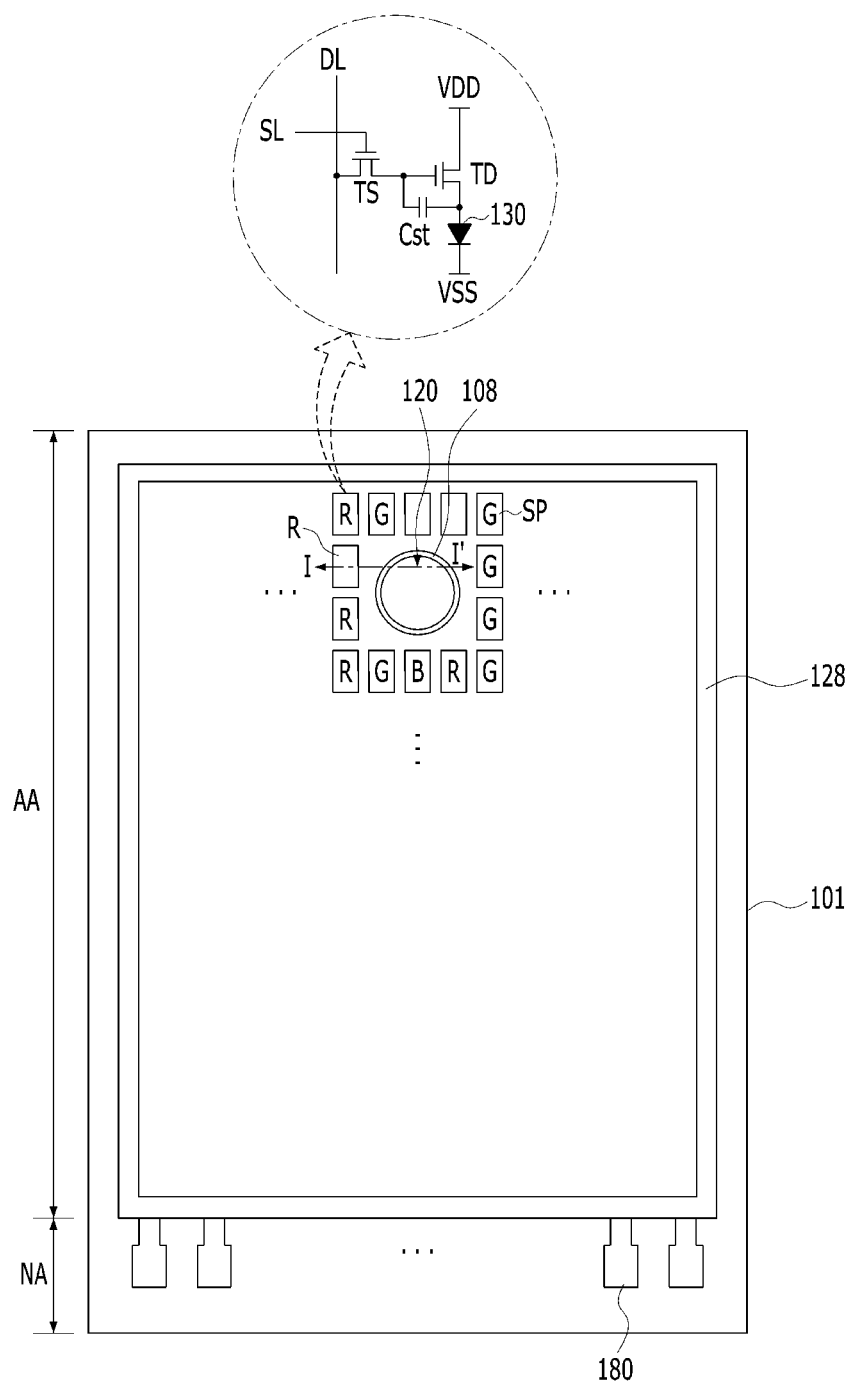
FIG. 1 is a view illustrating an organic light emitting display device having a substrate hole according to an embodiment of the present disclosure.
Figure 2:
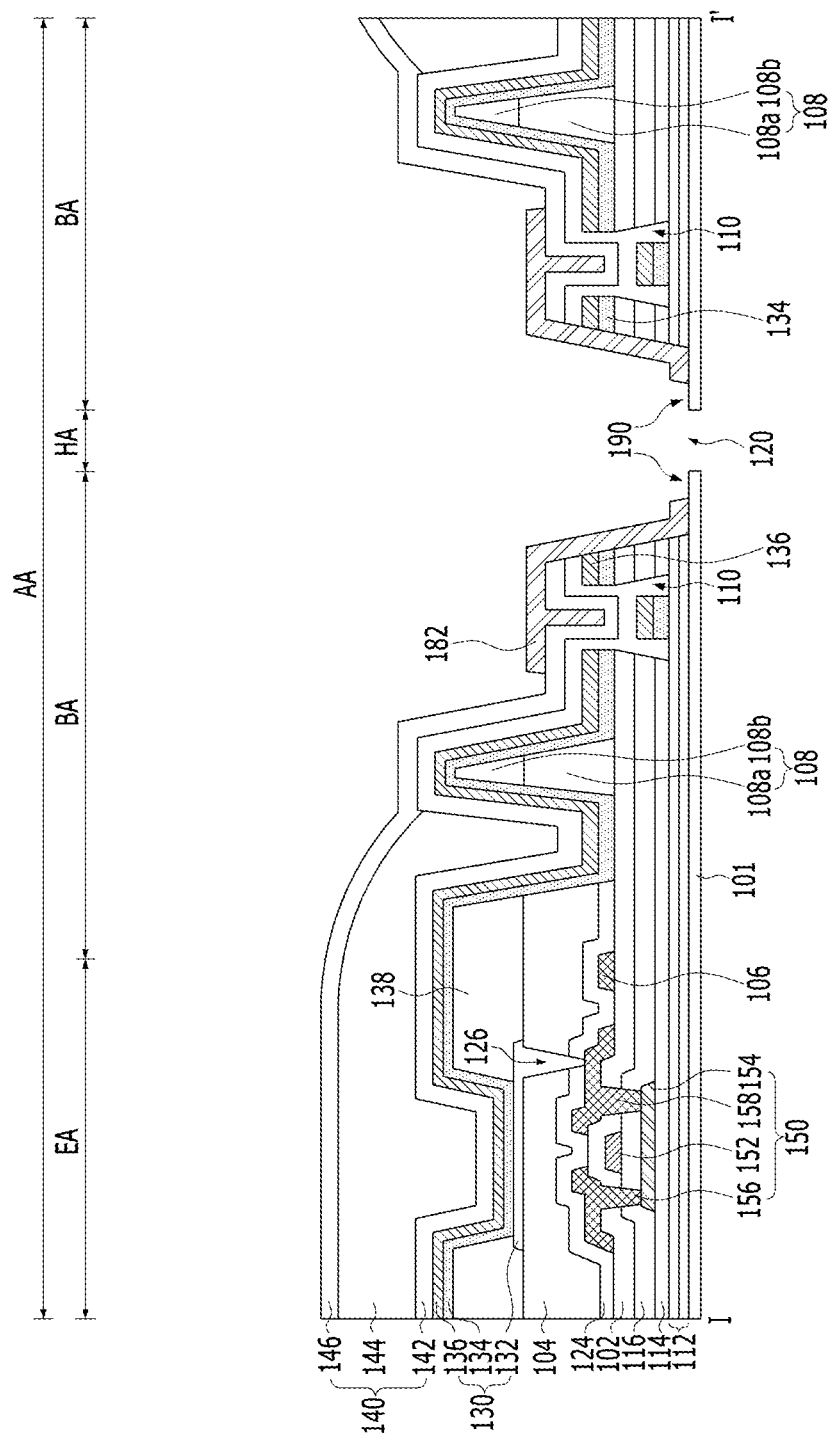
FIG. 2 is a cross-sectional view taken along line I-I of FIG. 1, illustrating the organic light emitting display device in which the substrate hole has a structure according to a first embodiment of the present disclosure.

Referring to FIGS. 1 and 2, a display device is illustrated. The display device includes an active area AA and a non-active area NA.

The non-active area NA is an area except for the active area AA. A plurality of pads 180 is disposed in the non-active area NA. The plurality of pads 180 supply drive signals to a plurality of signal lines 106 disposed in the active area AA, respectively. Here, each signal line 106 includes at least one of a scan line SL, a data line DL, a high-voltage (VDD) supply line or a low-voltage (VSS) supply line.

The active area AA includes emission areas EA, a barrier area BA and a hole area HA.

Unit pixels, each of which includes a light emitting element 130, are disposed in the emission areas EA, respectively. Each unit pixel may be constituted by red (R), green (G) and blue (B) subpixels, as illustrated in FIG. 1, or may be constituted by red (R), green (G), blue (B) and white (W) subpixels. Each subpixel includes one light emitting element 130, and a pixel driving circuit for independently driving the light emitting element 130.

The pixel driving circuit includes a switching transistor TS, a driving transistor TD and a storage capacitor Cst.

The switching transistor TS turns on when a scan pulse is supplied to a corresponding scan line SL. In this state, a data signal supplied to a corresponding data line DL is supplied to the capacitor Cst and a gate electrode of the driving transistor TD via the switching transistor TS.

The driving transistor TD controls current I supplied from a corresponding high-voltage (VDD) supply line to the light emitting element 130, in response to the data signal supplied to the gate electrode thereof, thereby adjusting the amount of light emitted from the light emission element 130. Even when the switching transistor TS turns off, the driving transistor TD supplies constant current I by a voltage charged in the storage capacitor Cst until a data signal of a next frame is supplied and, as such, the light emission element 130 maintains emission of light.

FIG. 2 illustrates an organic light emitting display device according to a first embodiment of the present disclosure. As illustrated in FIG. 2, the driving transistor TD, which is designated by reference numeral "150", includes an active layer 154 disposed on an active buffer layer 114, a gate electrode 152 overlapping with the active layer 154 under the condition that a gate insulating film 116 is interposed between the active layer 154 and the gate electrode 152, and source and drain electrodes 156 and 158 formed on an interlayer insulating film 102 while contacting the active layer 154.

The active layer 154 is made of at least one of an amorphous semiconductor material, a polycrystalline semiconductor material or an oxide semiconductor material. The active layer 154 includes a channel region, a source region and a drain region. The channel region overlaps with the gate electrode 152 under the condition that the gate insulating film 116 is interposed between the channel region and the gate electrode 152 and, as such, the channel region is defined between the source electrode 156 and the drain electrode 158. The source region is electrically connected to the source electrode 156 via a source contact hole passing through the gate insulating film 116 and the interlayer insulating film 102. The drain region is electrically connected to the drain electrode 158 via a drain contact hole passing through the gate insulating film 116 and the interlayer insulating film 102. A multi-buffer layer 112 and an active buffer layer 114 are disposed between the active layer 154 and a substrate 101. The multi-buffer layer 112 functions to delay diffusion of moisture and/or oxygen penetrating into the substrate 101. The multi-buffer layer 112 may be formed over the entire upper surface of the substrate 101.

The multi-buffer layer 112 may provide an environment capable of more stably realizing thin film formation while enabling more effective execution of various processes before execution of a main display panel fabrication process. The active buffer layer 114 performs functions of protecting the active layer 154 and blocking various kinds of defects propagated from the substrate 101. At least one of the multi-buffer layer 112, the active buffer layer 114 or the substrate 101 has a multilayer structure.

In this case, the uppermost layer of the multi-buffer layer 112 contacting the active buffer layer 114 is made of a material having etching characteristics different from those of the remaining layers of the multi-buffer layer 112, the active buffer layer 114 and the gate insulating layer 116. The uppermost layer of the multi-buffer layer 112 contacting the active buffer layer 114 is made of one of $SiN_x$ and $SiO_x$. The remaining layers of the multi-buffer layer 112, the active buffer layer 114 and the gate buffer layer 116 are made of the other of $SiN_x$ and $SiO_x$. For example, the uppermost layer of the multi-buffer layer 112 contacting the active buffer layer 114 is made of $SiN_x$, whereas the remaining layers of the multi-buffer layer 112, the active buffer layer 114 and the gate buffer layer 116 are made of $SiO_x$.

The light emitting element 130 includes an anode 132 connected to the drain electrode 158 of the driving transistor 150, at least one light emitting stack 134 formed on the anode 132, and a cathode 136 formed on the light emitting stack 134, to be connected to a low-voltage (VSS) supply line. Here, the low-voltage (VSS) supply line supplies a voltage lower than a high voltage supplied through a high-voltage (VDD) supply line.

The anode 132 is electrically connected to the drain electrode 158 of the driving transistor 150 exposed through a pixel contact hole 126 passing through a passivation film 124 and a planarization layer 104, which are disposed on the driving transistor 150. The anode 132 of each subpixel is disposed on the planarization layer 104 without being covered by a bank 138 such that the anode 132 is exposed.

When the anode 132 as described above is applied to a bottom emission type organic light emitting display device, the anode 132 is constituted by a transparent conductive film made of indium tin oxide (ITO) or indium zinc oxide (IZO). On the other hand, when the anode 132 is applied to a top emission type organic light emitting display device, the anode 132 is formed to have a multilayer structure including a transparent conductive film and an opaque conductive film having high reflection efficiency. The transparent conductive film is made of a material having a relatively high work function, for example, indium tin oxide (ITO) or indium zinc oxide (IZO). The opaque conductive film is formed to have a single-layer structure or a multilayer structure including Al, Ag, Cu, Pb, Mo, Ti or an alloy thereof. For example, the anode 132 is formed to have a structure in which a transparent conductive film, an opaque conductive film and a transparent conductive film are sequentially laminated.

The light emitting stack 134 is formed by laminating a hole transport layer, a light emitting layer and an electron transport layer on the anode 132 in this order or in reverse order.

The cathode 136 is formed on upper surfaces and side surfaces of the light emitting stack 134 and the bank 138, to face the anode 132 under the condition that the light emitting stack 134 is interposed between the anode 132 and the cathode 136.

An encapsulation unit 140 is formed to prevent penetration of external moisture or oxygen into the light emitting element 130, which is weak against moisture or oxygen. To this end, the encapsulation unit 140 includes a plurality of inorganic encapsulation layers 142 and 146, and an organic encapsulation layer 144 disposed between adjacent ones of the inorganic encapsulation layers 142 and 146. The inorganic encapsulation layer 146 is disposed at an uppermost position of the encapsulation unit 140. In this case, the encapsulation unit 140 includes at least one inorganic encapsulation layer 142 or 146 and at least one organic layer 144. The following description will be given in conjunction with an example in which the encapsulation unit 140 has a structure including a first inorganic encapsulation layer 142 and a second inorganic encapsulation layer 146, and one organic encapsulation layer 144 disposed between the first and second inorganic encapsulation layers 142 and 146 in accordance with the present disclosure.

The first inorganic encapsulation layer 142 is formed on the substrate 101 formed with the cathode 136 such that the first inorganic encapsulation layer 142 is disposed closest to the light emitting element 130. The first inorganic encapsulation layer 142 is made of an inorganic insulating material capable of being deposited at low temperature, for example, silicon nitride ($SiN_x$), silicon oxide ($SiO_x$), silicon oxynitride (SiON) or aluminum oxide ($Al_2O_3$). As such, the inorganic encapsulation layer 142 may be deposited in a low-temperature atmosphere. Accordingly, it may be possible to prevent damage to the light emitting stack 134, which is weak in a high-temperature atmosphere during deposition of the first inorganic encapsulation layer 142.

The second inorganic encapsulation layer 146 is formed to cover upper and side surfaces of the organic encapsulation layer 144 and an exposed upper surface of the first inorganic encapsulation layer 142 not covered by the organic encapsulation layer 144. As a result, upper and lower surfaces of the organic encapsulation layer 144 are sealed by the first and second inorganic encapsulation layers 142 and 146 and, as such, it may be possible to minimize or prevent penetration of external moisture or oxygen into the organic encapsulation layer 144 or penetration of moisture or oxygen present within the organic encapsulation layer 144 into the light emitting element 130. The second inorganic encapsulation layer 146 is made of an inorganic insulating material such as silicon nitride ($SiN_x$), silicon oxide ($SiO_x$), silicon oxynitride (SiON) or aluminum oxide ($Al_2O_3$).

The organic encapsulation layer 144 serves as a buffer to buffer stress generated among layers during bending of the organic light emitting display device while enhancing planarization performance. In addition, the organic encapsulation layer 144 is formed to have a greater thickness than the inorganic encapsulation layers 142 and 146, in order to prevent formation of cracks or pinholes caused by foreign matter. The organic encapsulation layer 144 is made of an organic insulating material such as acryl resin, epoxy resin, polyimide, polyethylene or silicon oxycarbide (SiOC).

Upon formation of the organic encapsulation layer 144, an outer dam 128 and an inner dam 108 are formed in order to restrict flowability of the organic encapsulation layer 144.

As illustrated in FIG. 1, at least one outer dam 128 may be formed to completely enclose the active area AA where light emitting elements 130 are disposed or may be formed only in an area between the active area AA and the non-active area NA. When a non-active area NA formed with a plurality of pads 180 is disposed at one side of the substrate 101, the outer dam 128 is disposed only at one side of the substrate 101. On the other hand, when non-active areas NA each formed with a plurality of pads 180 are disposed at opposite sides of the substrate 101, respectively, outer dams 128 are disposed at the opposite sides of the substrate 101, respectively. When plural outer dams 128 are disposed, the outer dams 128 are disposed in parallel while being spaced apart from one another by a certain distance. By virtue of such an outer dam 128, it may be possible to prevent diffusion of the organic encapsulation layer 144 into the non-active area NA.

Figure 3:
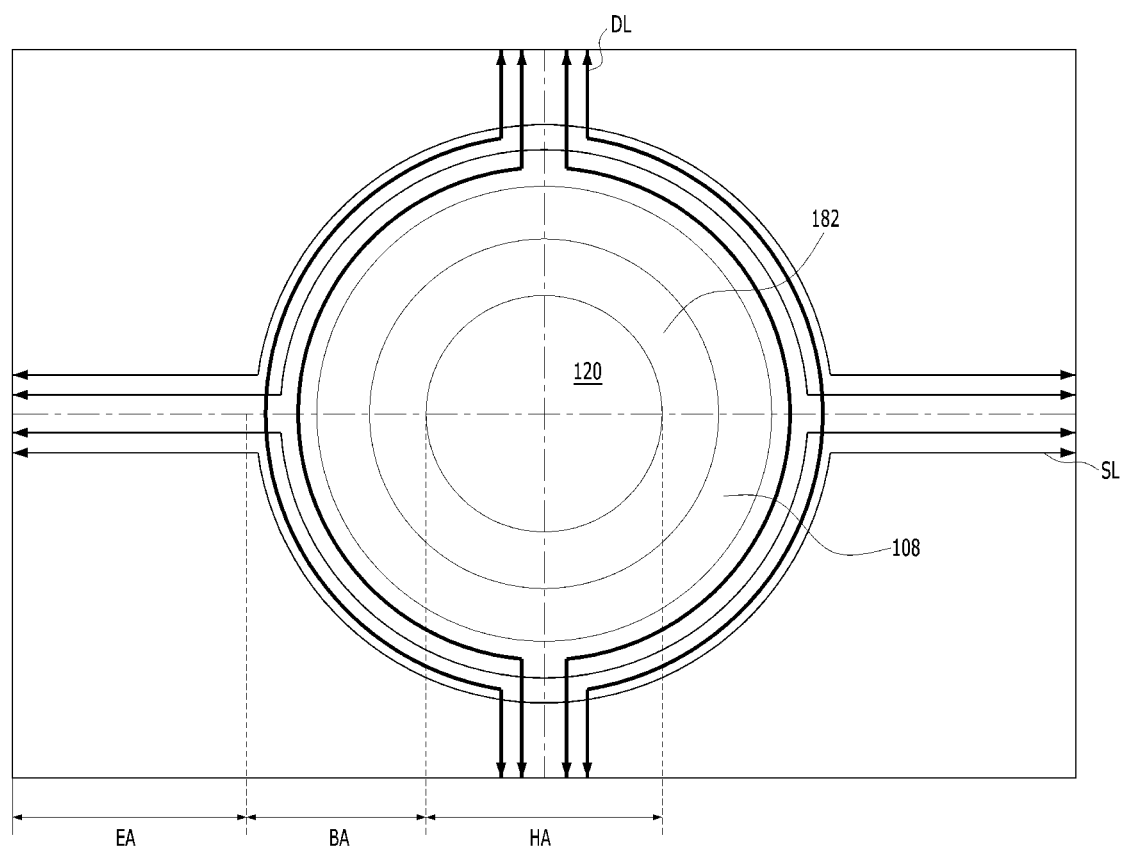
FIG. 3 is a plan view concretely illustrating a substrate hole area shown in FIG. 1 according to an embodiment of the present disclosure.

As illustrated in FIG. 3, at least one inner dam 108 is disposed to completely enclose a substrate hole 120 disposed in the hole area HA. In this case, the signal lines 106 disposed around the inner dam 108 and the substrate hole 120 while including the scan lines SL, the data lines DL, etc. extend along the circumference of the substrate hole 120 such that the signal lines 106 bypass the substrate hole 120.

Such an inner dam 108 is formed to have a single-layer structure or a multilayer structure including layers 108a and 108b, similarly to the outer dam 128. That is, each of the inner dam 108 and the outer dam 128 is formed simultaneously with at least one of the planarization layer 104, the bank 138 or a spacer (not shown), using the same material, and, as such, use of an additional mask process and an increase in costs may be prevented. For example, the lower layer 108a of the inner dam 108 is made of the same material as the planarization layer 104, and the upper layer 108b of the inner dam 108 is made of the same material as the bank 138. By virtue of such an inner dam 108, the organic encapsulation layer 144, which may function as a moisture penetration path, may be prevented from being diffused into the hole area HA.

The barrier area BA is disposed between the hole area HA and the emission areas EA disposed adjacent to the hole area HA. In the barrier area BA, the above-described inner dam 108, at least one blocking groove 110, a through hole 190 and a moisture penetration preventing layer 182 are formed.

The through hole 190 is formed to pass through the hole area HA and a plurality of thin film layers disposed in an area around the hole area HA. For example, the through hole 190 is formed to pass through the hole area HA and the inorganic insulating layers 112, 114, 116, and 102, the light emitting stack 134, the cathode 136 and the inorganic encapsulation layers 142 and 146, which are disposed in the area around the hole area HA, such that the upper surface of the substrate 101 or an upper surface of the multi-buffer layer 112 is exposed. In accordance with formation of the through hole 190, portions of the inorganic insulating layers 112, 114, 116, and 102, the light emitting stack 134, the inorganic encapsulation layers 142 and 146, etc. disposed in the hole area HA are removed and, as such, it may be possible to simplify a laser trimming process for forming the substrate hole 120.

Each blocking groove 110 is disposed between each inner dam 108 and the substrate hole 120. The blocking groove 110 is formed to pass through at least one inorganic insulating layer of the multi-buffer layer 112, the active buffer layer 114, the gate insulating film 116, or the interlayer insulating film 102 disposed between the substrate 101 and the planarization layer 104. In this case, side surfaces of the inorganic insulating layers 114, 116, and 102 exposed through the blocking groove 110 are formed to have a reversed taper shape such that the side surfaces form an acute angle or a right angle with respect to lower surfaces of the inorganic insulating layers 114, 116, and 102 exposed through the blocking groove 110. By virtue of such a blocking groove 110, each of the light emitting stack 134 and the cathode 136 is disconnected without having continuance during formation thereof. Accordingly, even when external moisture penetrates along the light emitting stack 134 disposed near the hole area HA, introduction of the penetrated moisture into the emission area EA may be prevented or delayed by the blocking groove 110. In addition, even when static electricity is introduced into the cathode 136 disposed near the hole area HA, diffusion of the introduced static electricity into the emission area EA may be prevented by the blocking groove 110. Furthermore, the blocking groove 110 exhibits great hardness, as compared to organic insulating materials, and, as such, it may be possible to prevent propagation of cracks into the emission area EA through removal of the inorganic insulating layers 114, 116, and 102, which may easily generate cracks when subjected to bending stress.

Meanwhile, portions of the first and second inorganic encapsulation layers 142 and 146 disposed in the blocking groove 110 are formed to be curved along the side surfaces of the inorganic insulating layers 114, 116, and 102 exposed through the blocking groove 110 while having a reversed taper shape. Due to such a curvature, cracks may be easily generated at the first and second inorganic encapsulating layers 142 and 146 and, as such, external moisture or oxygen may penetrate through the cracks formed at the first and second inorganic encapsulation layers 142 and 146. To this end, the moisture penetration preventing layer 182 is disposed on at least one of the first inorganic encapsulation layer 142 or the second inorganic encapsulation layer 146 between the inner dam 108 and the substrate hole 120 such that the moisture penetration preventing layer 182 overlaps with the blocking groove 110. The moisture penetration preventing layer 182 is formed to have a single-layer structure or a multilayer structure, using at least one of W, Mo, Co, Ag, Al, Cu, MoTi, Ta or Ti.

The moisture penetration preventing layer 182 is formed not only to overlap with the blocking groove 110, but also to extend to the side surface of the light emitting stack 134 exposed through the through hole 190. The moisture penetration preventing layer 182 is formed to cover side surfaces of the multi-buffer layer 112, the active buffer layer 114, the gate insulating film 116, the interlayer insulating film 102, the light emitting stack 134, the cathode 136 and the first and second inorganic encapsulation layers 142 and 146 exposed through the through hole 190. As such, the moisture penetration preventing layer 182 prevents external moisture or oxygen from penetrating into an outer side surface of the light emitting stack 134, an interface between the light emitting stack 134 and the interlayer insulating film 102 and an interface between the light emitting stack 134 and the cathode 136, which are exposed through the through hole 190.

The moisture penetration preventing layer 182 is formed after formation of the blocking groove 110 and the through hole 190. That is, the moisture penetration preventing layer 182 may be formed through a photolithography process and an etching process or may be formed through a non-lithography process. As the non-lithography process, a laser chemical vapor deposition process, a laser induced forwards transfer (LIFT) process, an electrohydrodynamic (EHD) jet printing process or the like may be used. In detail, the moisture penetration preventing layer 182 may be formed by injecting a solution such as W(CO)6, Mo(CO)6, Co(CO)6 or the like onto the substrate 101 through a laser chemical vapor deposition process. In this case, a conductive material is left as (CO) 6 is evaporated and, as such, forms the moisture penetration preventing layer 182. Alternatively, the moisture penetration preventing layer 182 may be formed by injecting a conductive solution or conductive powder of Ag, Al, Cu or the like onto the substrate 101 through a laser induced forwards transfer (LIFT) process or an electrohydrodynamics (EHD) jet printing process. In this case, when the moisture penetration preventing layer 182 is injected onto the hole area HA, which is not a desired area for the moisture penetration preventing layer 182, the moisture penetration preventing layer 182 injected onto the hole area HA is removed through a laser trimming process. After the laser trimming process, the moisture penetration preventing layer 182 injected onto a desired area may be cured and sintered.

The hole area HA is disposed within the active area AA and, as such, may be enclosed by a plurality of subpixels SP each including one light emitting element 130. At least one substrate hole 120 disposed in the hole area HA is illustrated as having a circular shape, but may be formed to have a polygonal shape or an oval shape. The substrate hole 120 is formed to pass through the substrate 101. The substrate hole 120 overlaps with the through hole 190 while having a smaller width than the through hole 190.

Figure 4:
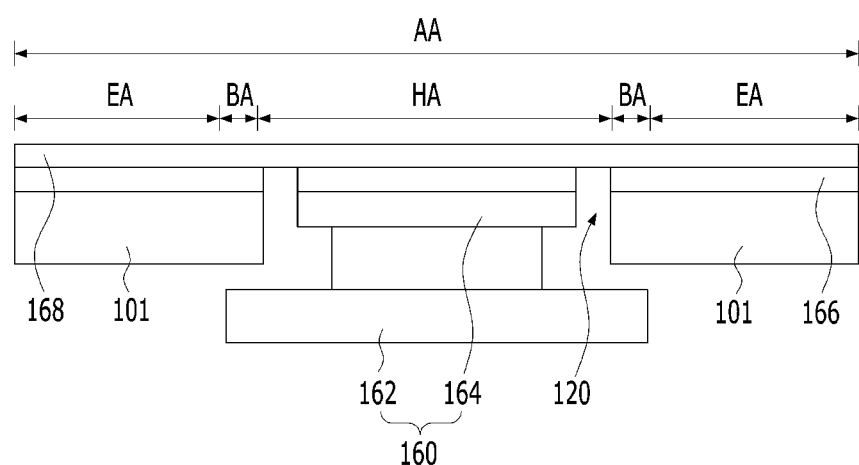
FIG. 4 is a cross-sectional view illustrating a camera module fitted in a substrate hole illustrated in FIG. 2 according to an embodiment of the present disclosure.

An electronic component including a camera, a speaker, a flash light source or a biometric sensor such as a fingerprint sensor is disposed in the hole area HA so as to be inserted into the substrate hole 120. The following description will be given in conjunction with an example in which a camera module 160 is disposed in the hole area HA in accordance with the present disclosure, as illustrated in FIG. 4.

The camera module 160 includes a camera lens 164 and a camera driver 162.

The camera driver 162 is disposed at a lower surface of the substrate 101, which is included in a display panel, such that the camera driver 162 is connected to the camera lens 164.

The camera lens 164 is disposed within the substrate hole 120 extending from a lower thin film layer (for example, the substrate 101 or a back plate) disposed at a lowermost position of the active area AA to an upper thin film layer (for example, a polarization plate 166) disposed at an uppermost position of the active area AA. Accordingly, the camera lens 164 is disposed to face a cover glass 168. In this case, the substrate hole 120 may be disposed to pass through the substrate 101, the inorganic insulating layers, and the polarization plate 166, or may be disposed to pass through the substrate 101 and the polarization plate 166.

As the camera module 160 is disposed within the active area AA, it may be possible to minimize the bezel area, which is a non-display area of the display device.

Figure 5:
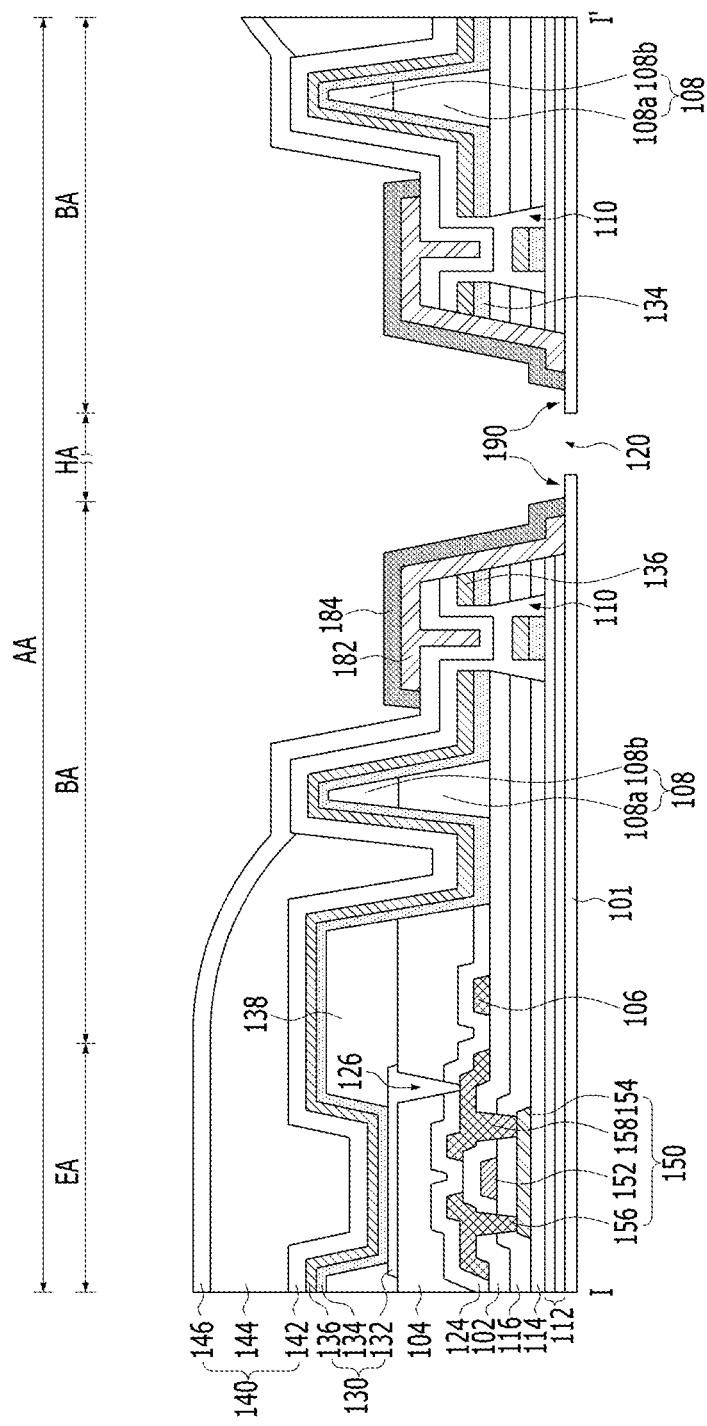
FIG. 5 is a cross-sectional view illustrating an organic light emitting display device having a substrate hole according to a second embodiment of the present disclosure.

FIG. 5 is a cross-sectional view illustrating an organic light emitting display device according to a second embodiment of the present disclosure.

The organic light emitting display device illustrated in FIG. 5 includes the same constituent elements as those of the organic light emitting display device illustrated in FIG. 2, except that a black layer 184 is further included. Accordingly, no detailed description will be given of the same constituent elements for the sake of brevity.

The black layer 184 is formed over the moisture penetration preventing layer 182 such that the black layer 184 has a greater width than the moisture penetration preventing layer 182. That is, the black layer 184 is formed to cover upper and side surfaces of the moisture penetration preventing layer 182 disposed in the barrier area BA such that the black layer 184 contacts the upper and side surfaces of the moisture penetration preventing layer 182. Accordingly, it may be possible to prevent externally incident light from being reflected by the moisture penetration preventing layer 182 and, as such, the moisture penetration preventing layer 182 disposed in the barrier area BA is prevented from being visible.

The black layer 184 is formed through a photolithography process or a non-lithography process such as an inkjet process after sequential formation of the through hole 190 and the moisture penetration preventing layer 182.

Figure 6A:
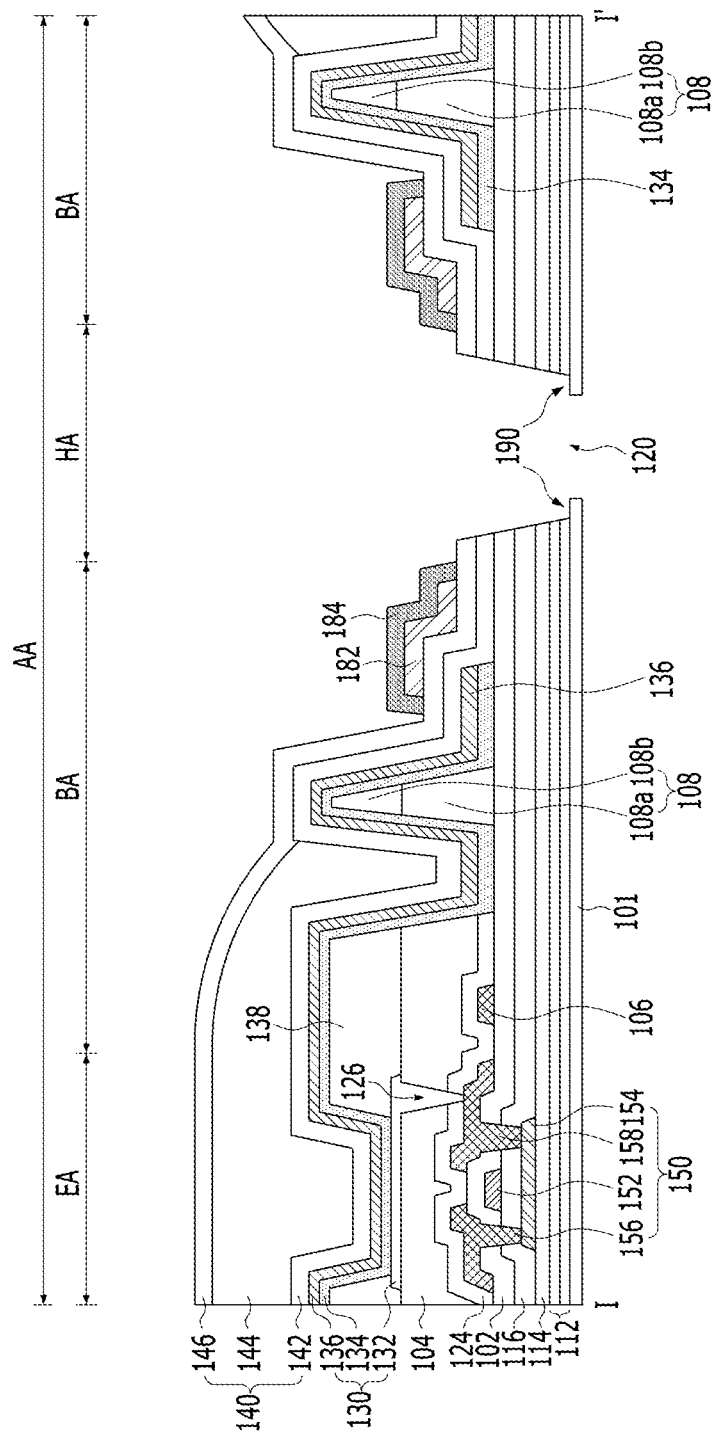
FIGS. 6A to 6C are cross-sectional views illustrating different embodiments of a light emitting stack and a moisture penetration preventing layer illustrated in FIG. 5, respectively, according to embodiments of the present disclosure.
Figure 6B:
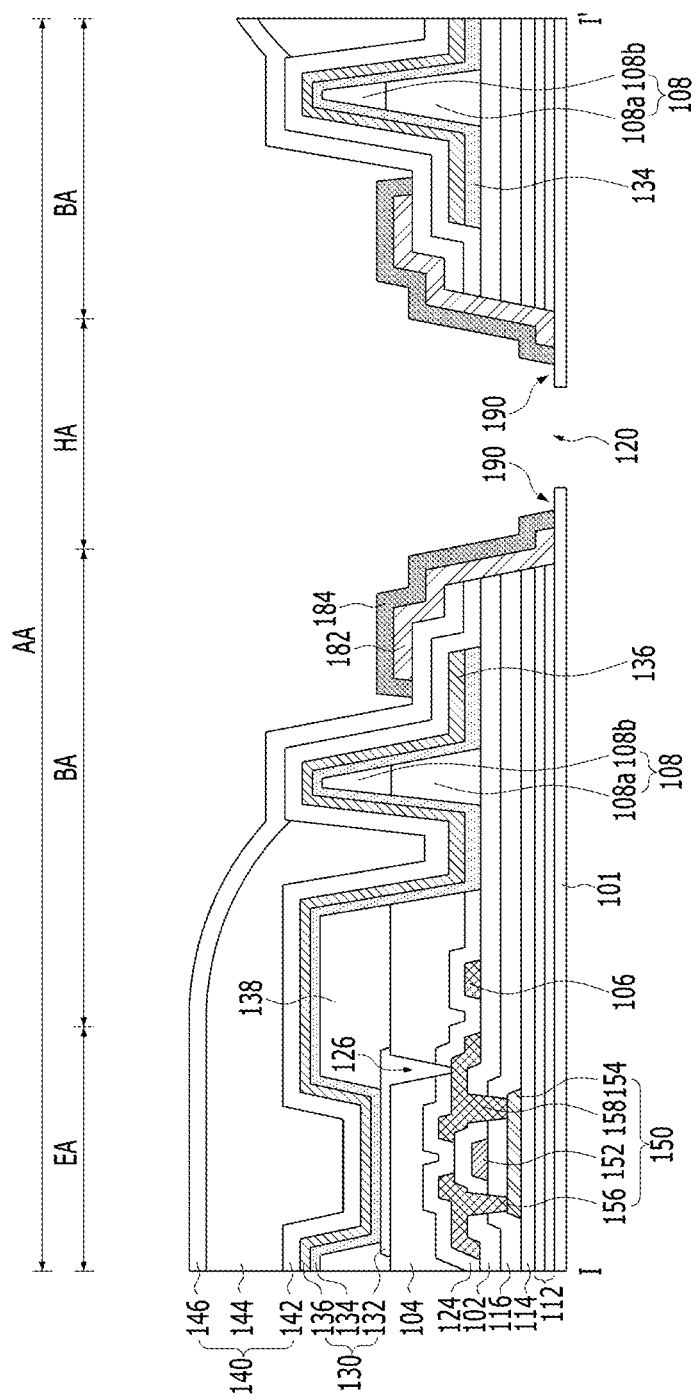
Figure 6C:
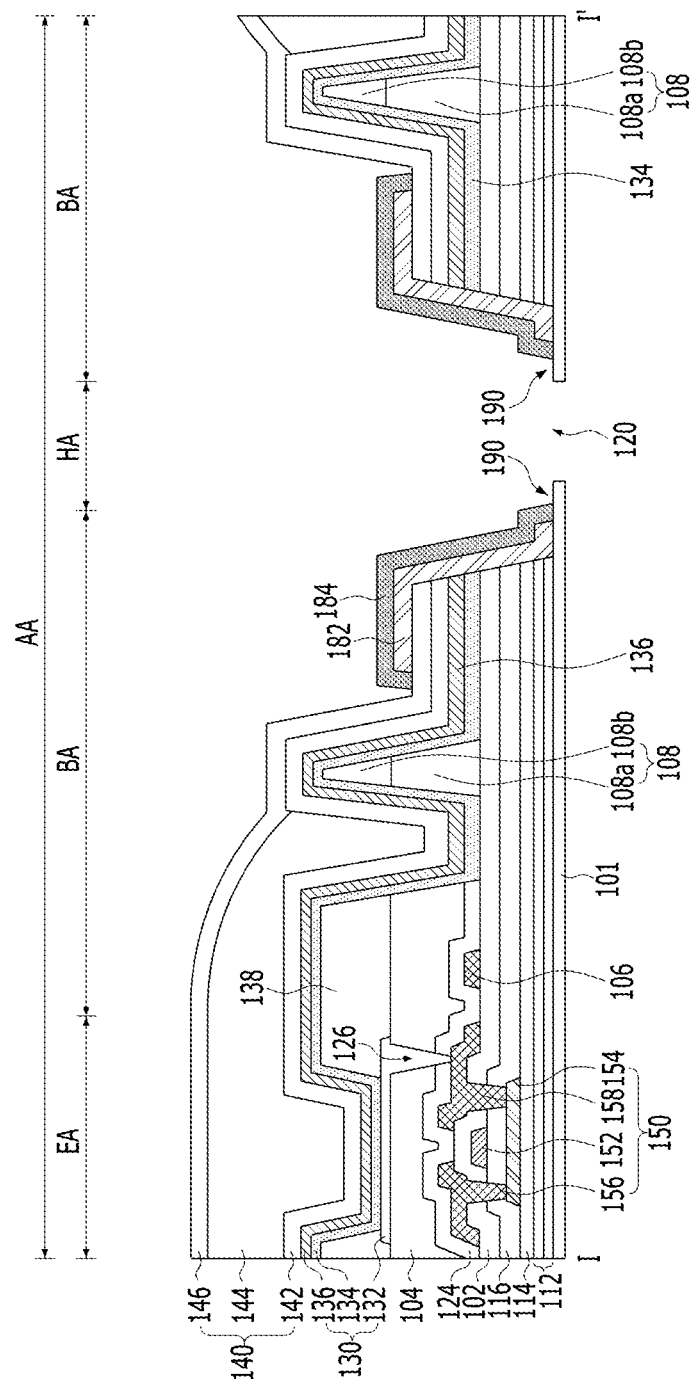

Meanwhile, although the light emitting stack 134 and the cathode 136 illustrated in FIG. 2 or 5 have been described in conjunction with the example in which the light emitting stack 134 and the cathode 136 have structures disconnected by the blocking groove 110 without having continuance, the light emitting stack 134 and the cathode 136 may have disconnected structures without using the blocking groove 110, as illustrated in FIGS. 6A to 6C. That is, the light emitting stack 134 and the cathode 136 may not be formed in a portion of the barrier area BA and the hole area HA surrounded by the inner dam 108 in accordance with a deposition process using a shadow mask. In this case, the outer side surface of the light emitting stack 134 illustrated in FIG. 6A is protected by the inorganic encapsulation layers 142 and 146 and, as such, the moisture penetration preventing layer 182 and the black layer 184 are disposed over the inorganic encapsulation layers 142 and 146 between the inner dam 108 and the substrate hole 120. On the other hand, the outer side surface of the light emitting stack 134 illustrated in FIG. 6B is disposed to face the moisture penetration preventing layer 182 and, as such, is protected by the inorganic encapsulation layers 142 and 146, the moisture penetration preventing layer 182 and the black layer 184. Otherwise, as illustrated in FIG. 6C, the outer side surface of the light emitting stack 134 is disposed to contact the moisture penetration preventing layer 182 and, as such, is protected by the moisture penetration preventing layer 182 and the black layer 184. Accordingly, the outer surface of the light emitting stack 134 in each of the cases illustrated in FIGS. 6A to 6C is protected by at least one of the inorganic encapsulation layers 142 and 146, the moisture penetration preventing layer 182, or the black layer 184 and, as such, it may be possible to prevent external moisture or oxygen from penetrating into the light emitting stack 134.

Figure 7:
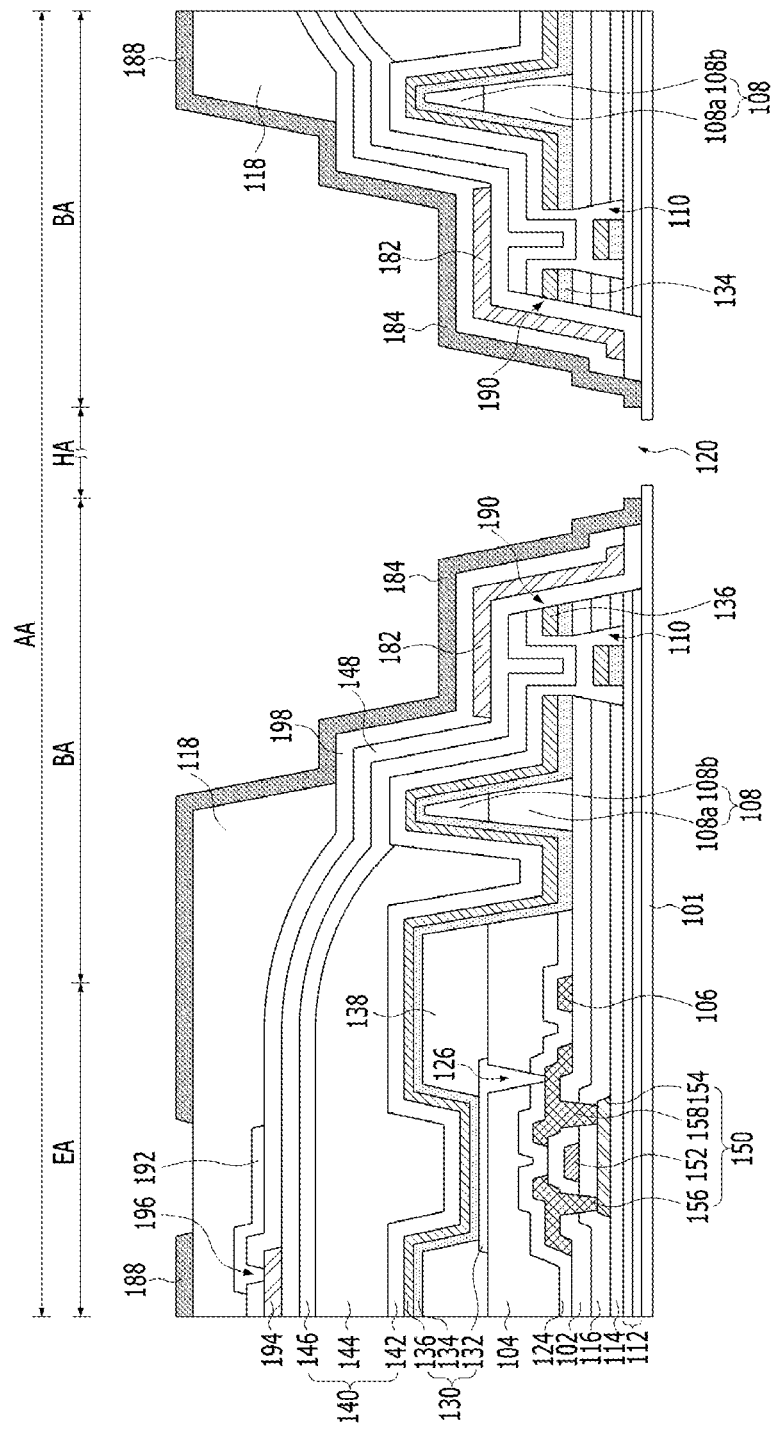
FIG. 7 is a cross-sectional view illustrating an organic light emitting display device having a substrate hole according to a third embodiment of the present disclosure.

FIG. 7 is a cross-sectional view illustrating a display device including a substrate hole according to a third embodiment of the present disclosure.

The display device illustrated in FIG. 7 includes the same constituent elements as those of the display device illustrated in FIG. 2, except that a touch sensor is further included. Accordingly, no detailed description will be given of the same constituent elements for the sake of brevity.

The touch sensor includes a plurality of touch electrodes 192, and a plurality of bridges 194 connecting the touch electrodes 192.

At least one of each touch electrode 192 or each bridge 194 may be constituted by a transparent conductive film made of ITO or IZO, may be constituted by a mesh metal film having a mesh structure, or may be constituted by a transparent conductive film as described above and a mesh metal film disposed over or beneath the transparent conductive film. Here, the mesh metal film is formed to have a mesh structure, using at least one conductive layer made of Ti, Al, Mo, MoTi, Cu, Ta or ITO while exhibiting better conductivity than the transparent conductive film. For example, the mesh metal film may be formed to have a triple-layer structure of Ti/Al/Ti, MoTi/Cu/MoTi, or Ti/Al/Mo. At least one of the mesh metal film or each bridge 194 overlaps with the bank 138.

One of each bridge 194 and each touch electrode 192 is disposed on one of a touch buffer film 148 and the uppermost inorganic encapsulation layer 146 included in the encapsulation unit 140, whereas the other of each bridge 194 and each touch electrode 192 is disposed on a touch insulating film 198. That is, although each touch electrode 192 and each bridge 194 illustrated in FIG. 7 have been described in conjunction with the case in which each touch electrode 192 is disposed on the touch insulating film 198, and each bridge 194 is disposed on the touch buffer film 148, each bridge 194 may be disposed on the touch insulating film 198, and each touch electrode 192 may be disposed on the touch buffer film 148.

At least one of each touch electrode 192 or each bridge 194 as described above is formed simultaneously with the moisture penetration preventing layer 182. To this end, the moisture penetration preventing layer 182 is made of the same material as at least one of each touch electrode 192 or each bridge 194.

The touch insulating film 198 includes touch contact holes 196 each electrically connecting corresponding ones of the bridges 194 and the touch electrodes 192. At least one of the touch insulating film 198 or the touch buffer film 148 extends to the barrier area BA, to cover the outer side surface of the light emitting stack 134 exposed through the through hole 190.

A touch protection film 118 is disposed on the touch insulating film 198, on which the touch electrodes 192 are disposed, in order to protect the touch sensors. The touch protection film 118 is made of an inorganic insulating material or an organic insulating material. A black matrix 188 is disposed on the touch protection film 118 such that the black matrix 188 overlaps with the bank 138. The black matrix 188 minimizes reflection of external light, thereby achieving an enhancement in visibility without using a polarization plate. Accordingly, the present disclosure achieves structural simplification in that use of a polarization plate is eliminated. The black matrix 188 is made of the same material as the black layer 184 overlapping with the moisture penetration preventing layer 182. The black layer 184 may be disposed to overlap with the moisture penetrating preventing layer 182 under the condition that the touch insulating film 198 is disposed between the black layer 184 and the moisture penetration preventing layer 182, or may be disposed on the moisture penetration preventing layer 182, to physically contact the moisture penetration preventing layer 182 without interposition of the touch insulating film 198.

As such, in the present disclosure, it may be possible to prevent external moisture or oxygen from penetrating into an outer surface of the light emitting stack 134 by the moisture penetration preventing layer 182, the touch insulating film 198, the touch buffer film 148, and the black layer 184. Accordingly, an enhancement in reliability may be achieved. In addition, in the present disclosure, it may be possible to prevent reflection of external light by the black layer 184 without using a polarization plate. Accordingly, structural simplification and a reduction in costs may be achieved.

FIGS. 8A to 8H are cross-sectional views explaining a method for manufacturing the organic light emitting display device illustrated in FIG. 7 according to an embodiment of the present disclosure.

Figure 8A:
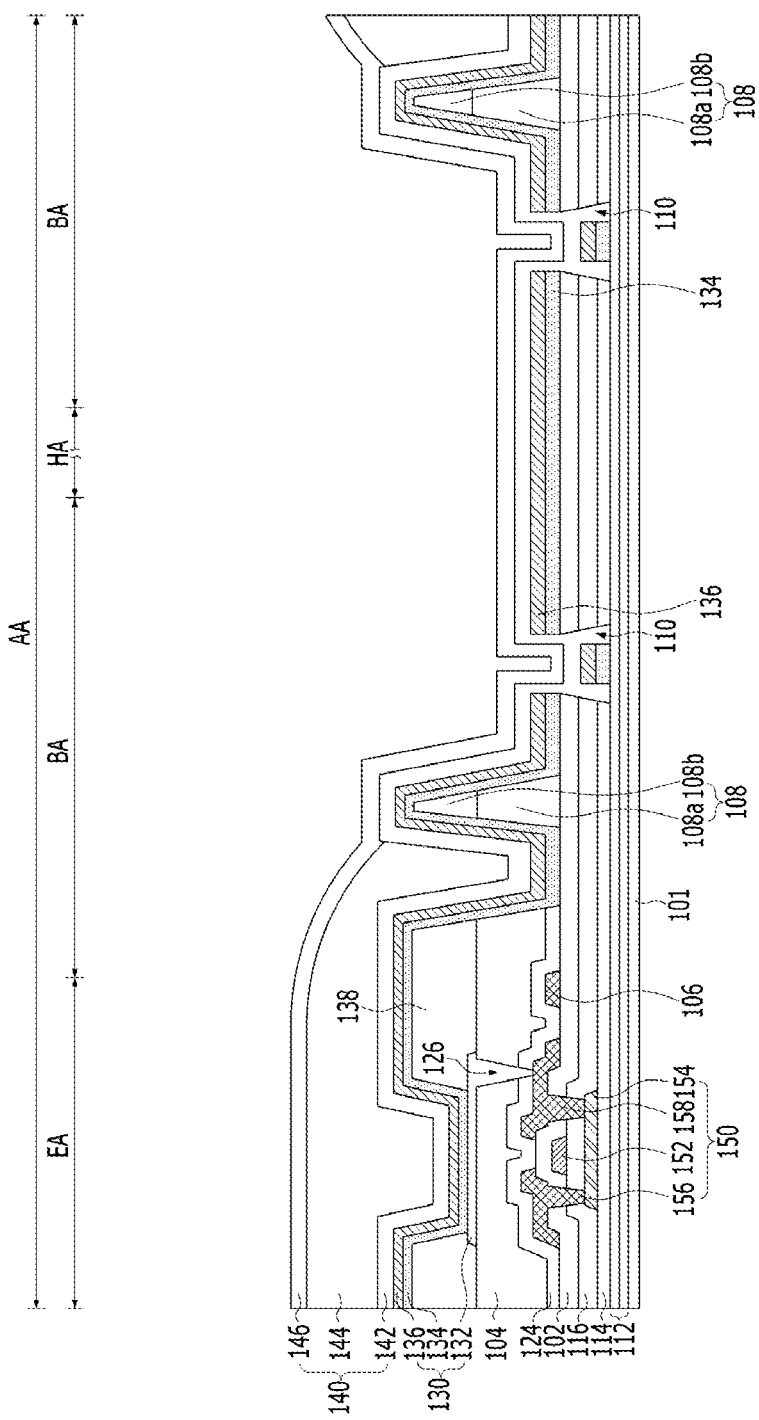
FIGS. 8A to 8H are cross-sectional views explaining a method for manufacturing the organic light emitting display device having the substrate hole illustrated in FIG. 7 according to an embodiment of the present disclosure.

In detail, the multi-buffer layer 112 and the active buffer layer 114 are formed on the substrate 101, as illustrated in FIG. 8A. Here, the substrate 101 is made of a plastic material having flexibility, to be bendable. For example, the substrate 101 is made of polyimide (PI), polyethylene terephthalate (PET), polyethylene naphthalate (PEN), polycarbonate (PC), polyethersulfone (PES), polyarylate (PAR), polysulfone (PSF), or cyclic-olefin copolymer (COC).

Thereafter, the active layer 154 is formed on the active buffer layer 114 through a photolithography process and an etching process. The gate insulating film 116, which is made of an inorganic insulating material, is then formed over the active layer 154. The gate insulating electrode 152 is then formed on the gate insulating film 116, together with a lower pad electrode, through a photolithography process and an etching process. Subsequently, the interlayer insulating film 102 made of an inorganic insulating material is formed. The interlayer insulating film 102 and the gate insulating film 116 are then patterned through a photolithography process and an etching process, thereby forming source and drain contact holes (not shown), through which the active layer 154 is exposed. Thereafter, the interlayer insulating film 102, the gate insulating film 116 and the active buffer layer 114 are patterned through a photolithography process and an etching process, thereby forming the blocking groove 110, through which the upper surface of the multi-buffer layer 112 is exposed. At this time, a portion of the multi-buffer layer 112 may also be patterned in accordance with the etching process and, as such, a side surface of the multi-buffer layer 112 may be exposed through the blocking groove 110.

Subsequently, the source and drain electrodes 156 and 158 are formed on the interlayer insulating film 102 through a photolithography process and an etching process. The planarization layer 104 and the anode 132 are then sequentially formed through a photolithography process and an etching process. Subsequently, the bank 138, the inner dam 108, and the outer dam 128 are simultaneously formed through a photolithography process and an etching process using the same mask.

Thereafter, the organic light emitting layer 134 and the cathode 136 are sequentially formed on the substrate 101 formed with the bank 138 through a deposition process using a shadow mask. In this case, the light emitting stack 134 and the cathode 136 are disconnected without having continuance by the blocking groove 110. Next, at least one inorganic encapsulation layer (the inorganic encapsulation layers 142 and 146 in the illustrated case) and at least one organic encapsulation layer (the organic encapsulation layer 144 in the illustrated case) are laminated over the cathode 136, thereby forming the encapsulation unit 140. In this case, the organic encapsulation layer 144 is formed in an area, except for the hole area HA and the non-active area NA, by virtue of the inner dam 108 and the outer dam 128.

Figure 8B:
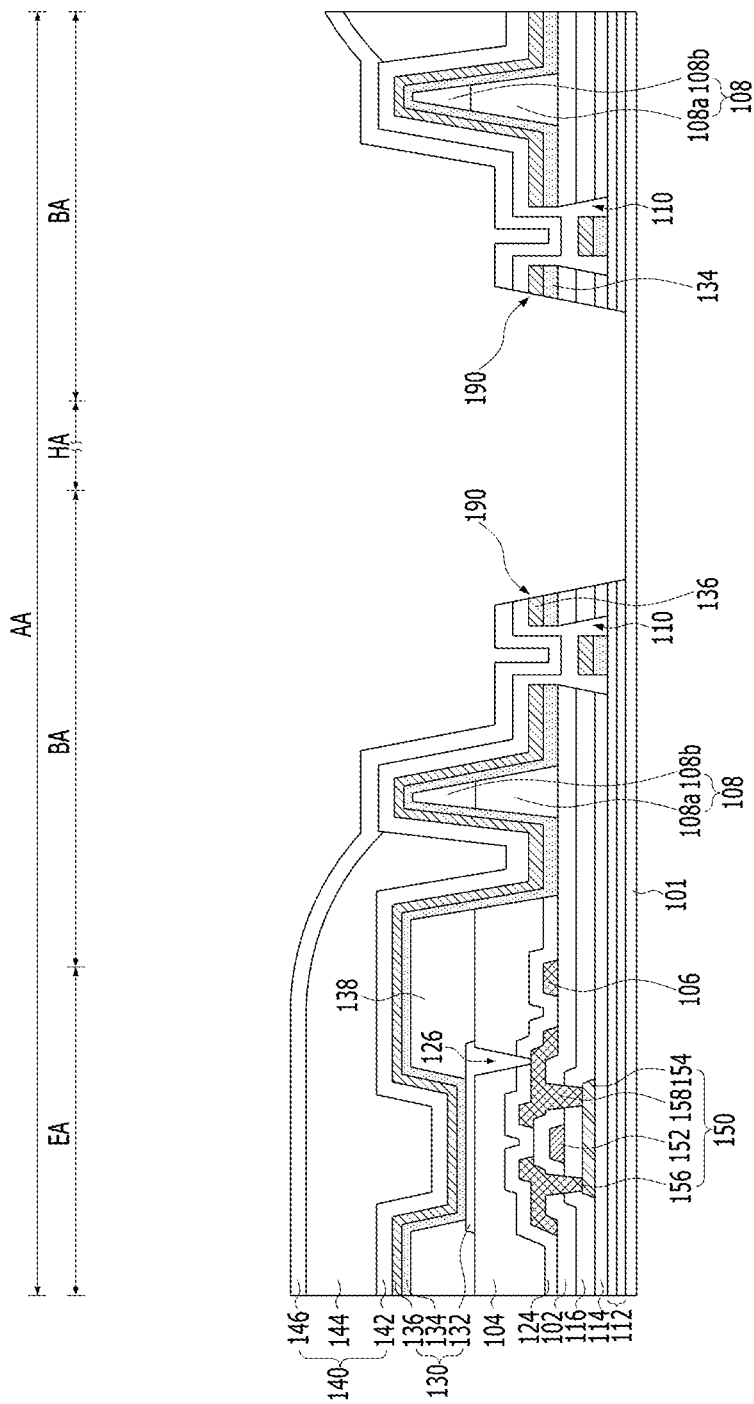

Thereafter, the inorganic encapsulation layers 142 and 146, the cathode 136, the light emitting stack 134, the interlayer insulating film 102, the gate insulating film 116, the active buffer layer 114 and the multi-buffer layer 112 are patterned through a photolithography process and an etching process, thereby forming the through hole 190, as illustrated in FIG. 8B.

Figure 8C:
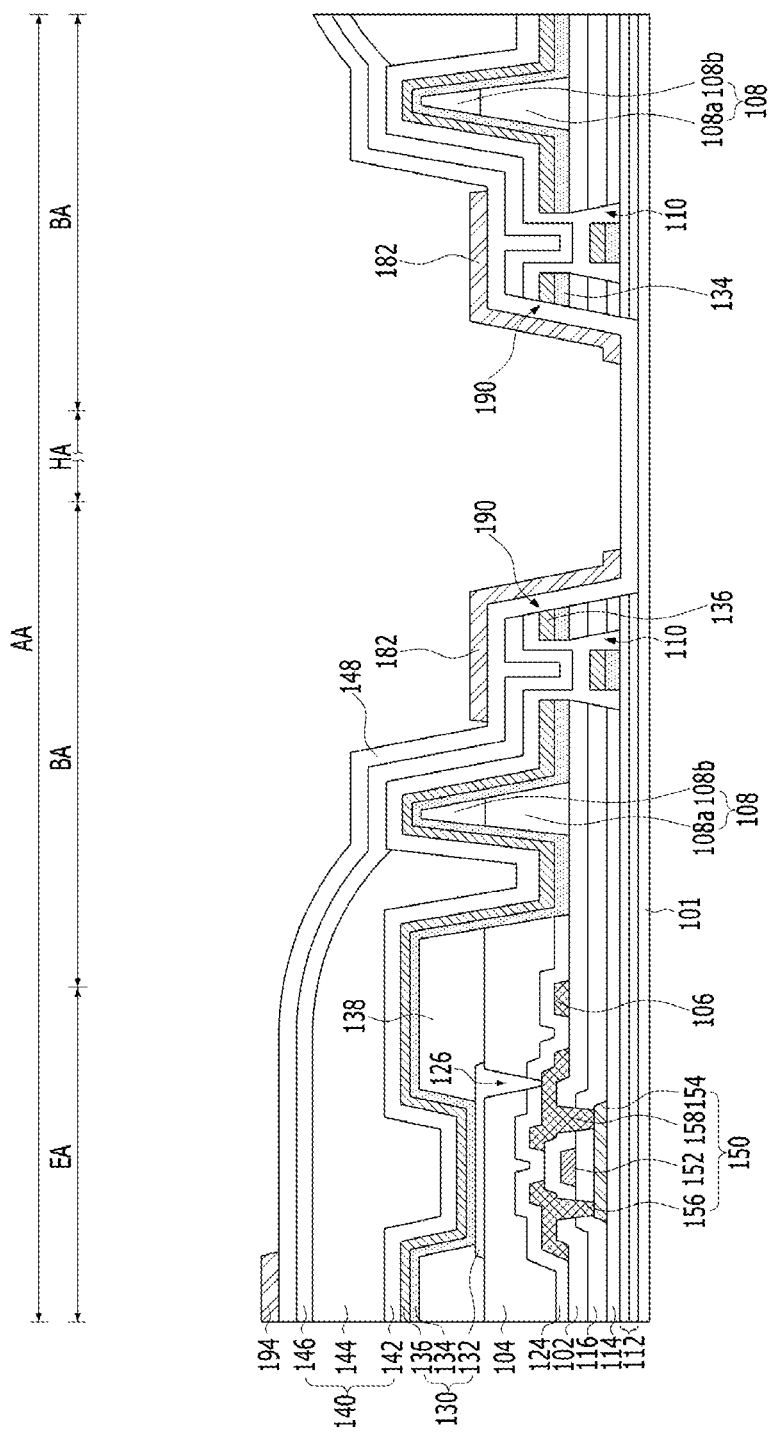
Figure 8D:
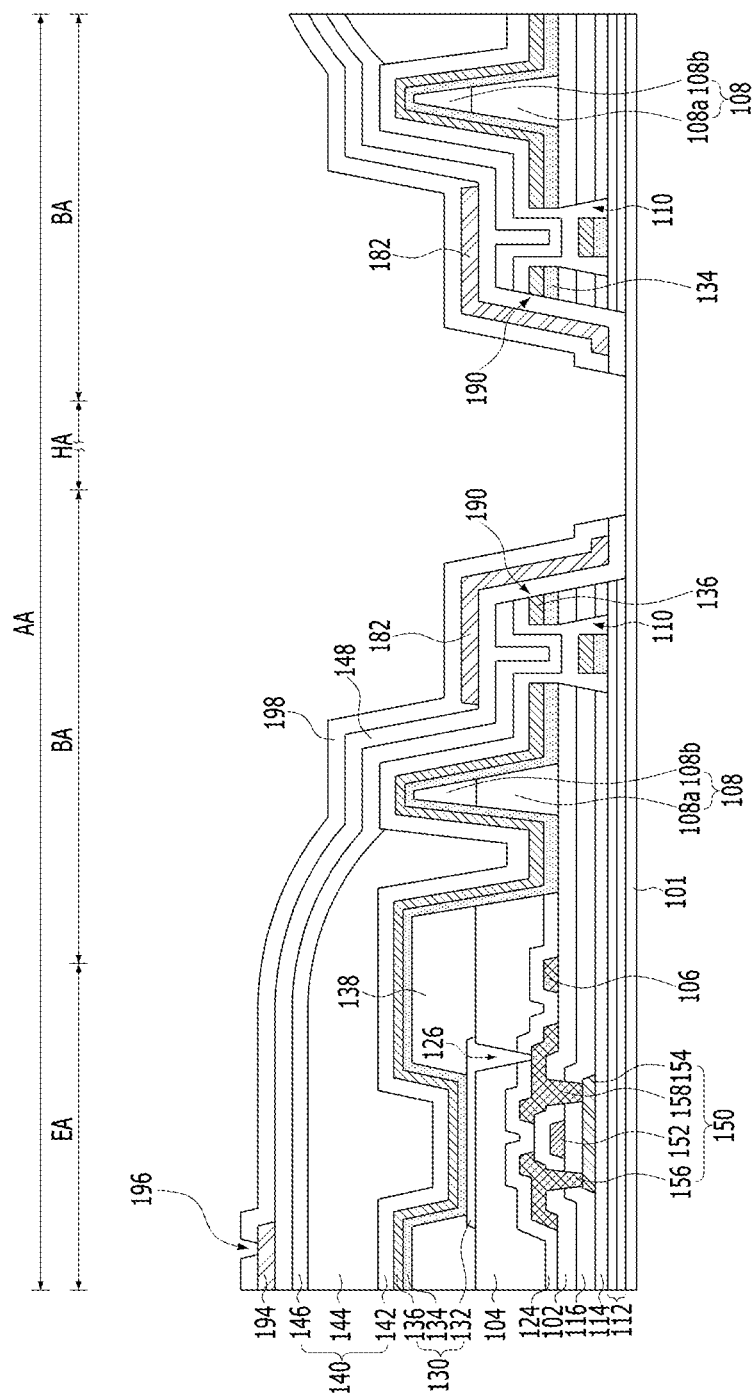
Figure 8E:
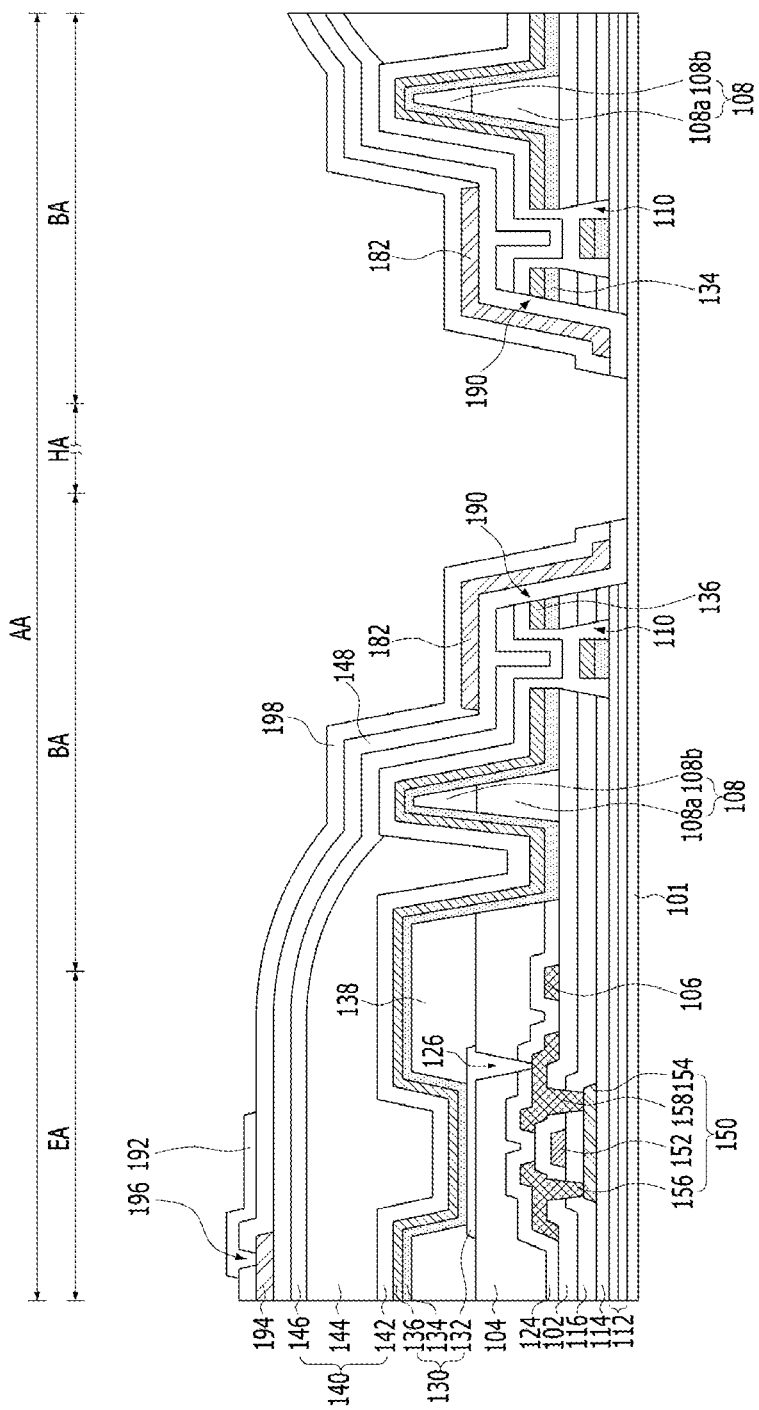
Figure 8F:
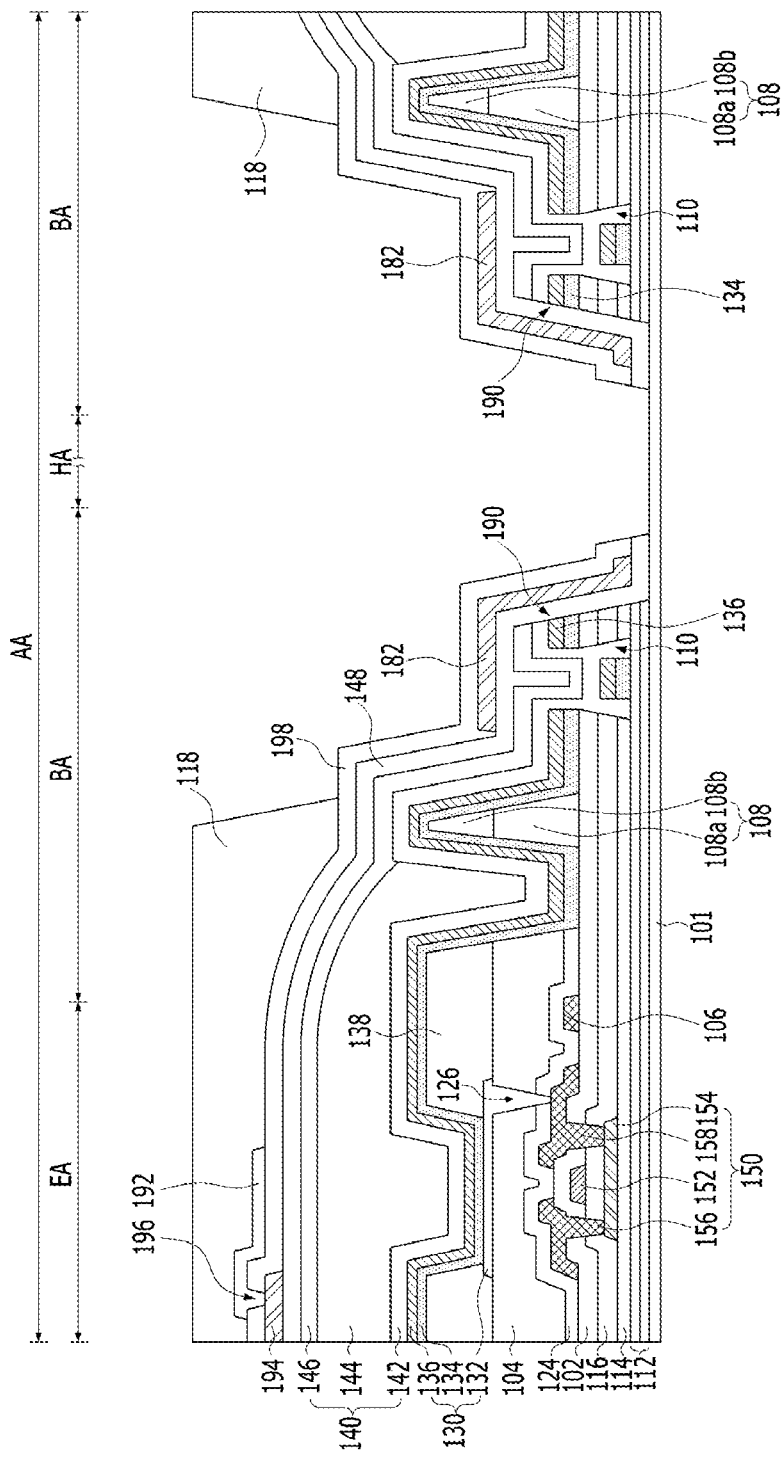
Figure 8G:
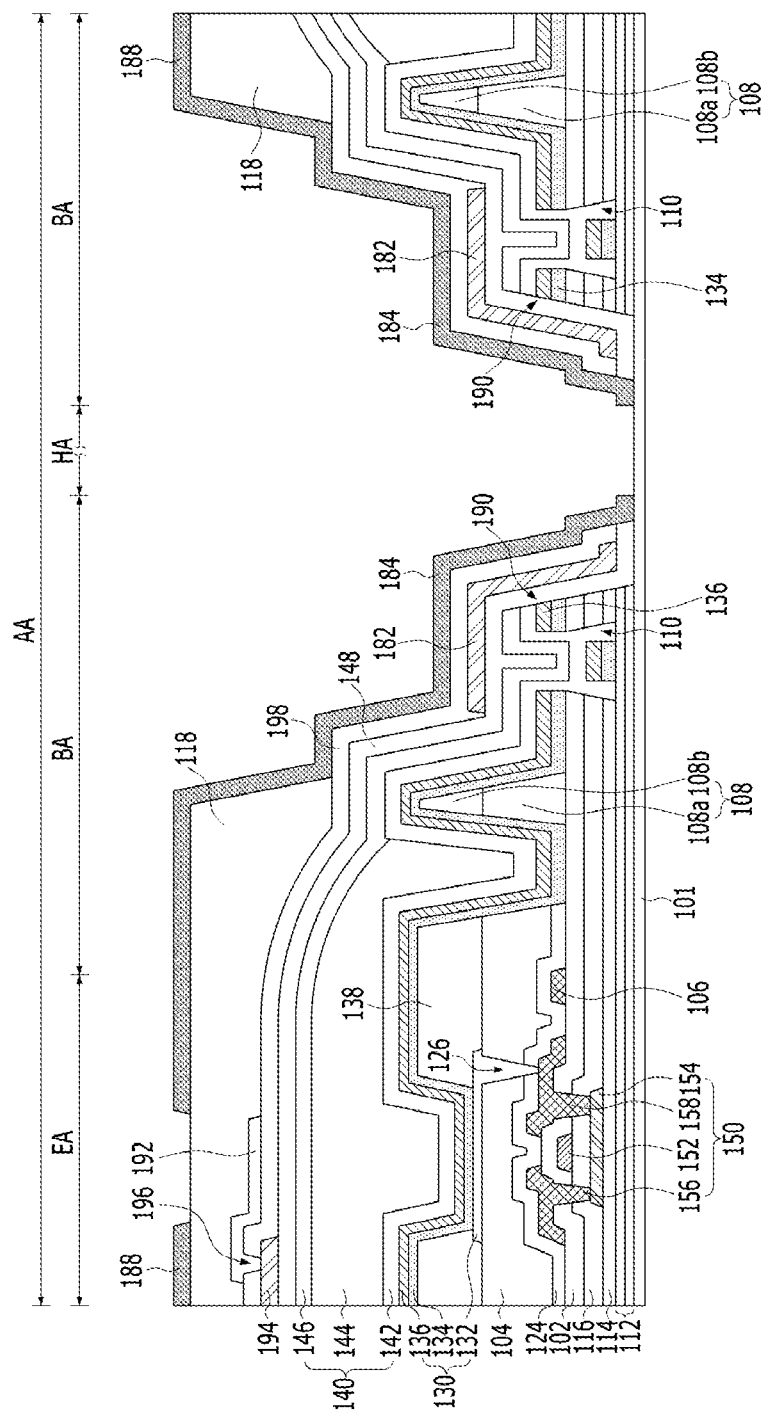
Figure 8H:
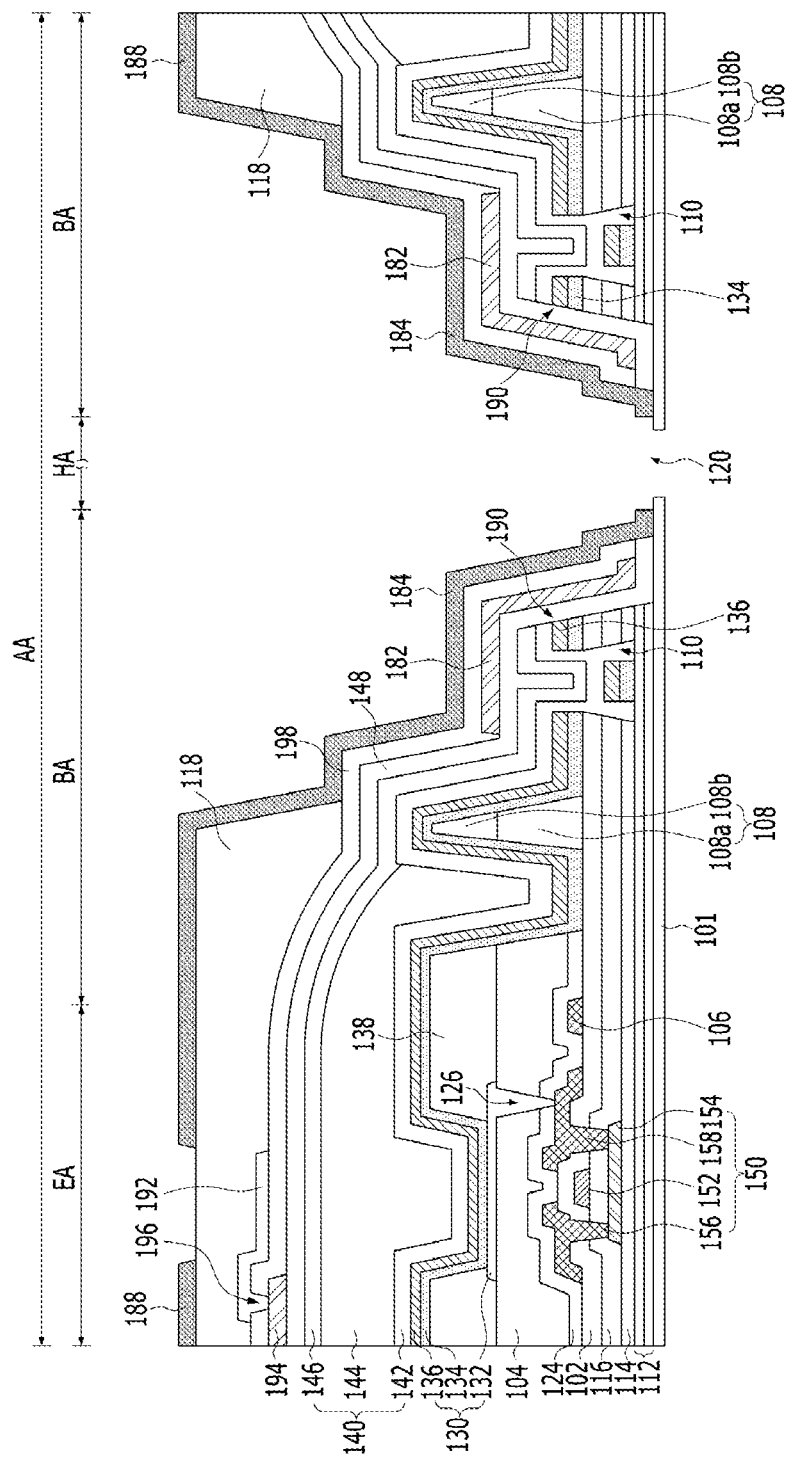

Subsequently, an inorganic or organic insulating material is coated over the entire upper surface of the substrate 101 formed with the through hole 190, thereby forming the touch buffer film 148, as illustrated in FIG. 8C. The bridges 194 and the moisture penetration preventing layer 182 are then simultaneously formed on the substrate 101 formed with the touch buffer film 148 through a photolithography process and an etching process. An inorganic or organic insulating material is then coated over the entire upper surface of the substrate 101 formed with the bridges 194 and the moisture penetration preventing layer 182, thereby forming the touch insulating film 198, as illustrated in FIG. 8D. Thereafter, the touch insulating film 198 is patterned through a photolithography process and an etching process, thereby forming the touch contact holes 196. At this time, portions of the touch insulating film 198 and the touch buffer film 148 disposed in the hole area HA are also removed. Subsequently, the touch electrodes 196 are formed on the substrate 101 formed with the touch contact holes 196 through a photolithography process and an etching process, as illustrated in FIG. 8E. The touch protection film 118 to protect touch sensors is then formed on the substrate 101 through a photolithography process and an etching process, as illustrated in FIG. 8F. Next, the black matrix 188 and the black layer 184 are simultaneously formed on the substrate 101 formed with the touch protection film 118 through a photolithography process and an etching process, as illustrated in FIG. 8G. Finally, a desired portion of the substrate 101 is removed through a laser trimming process, thereby forming the substrate hole 120, as illustrated in FIG. 8H.

Figure 9:
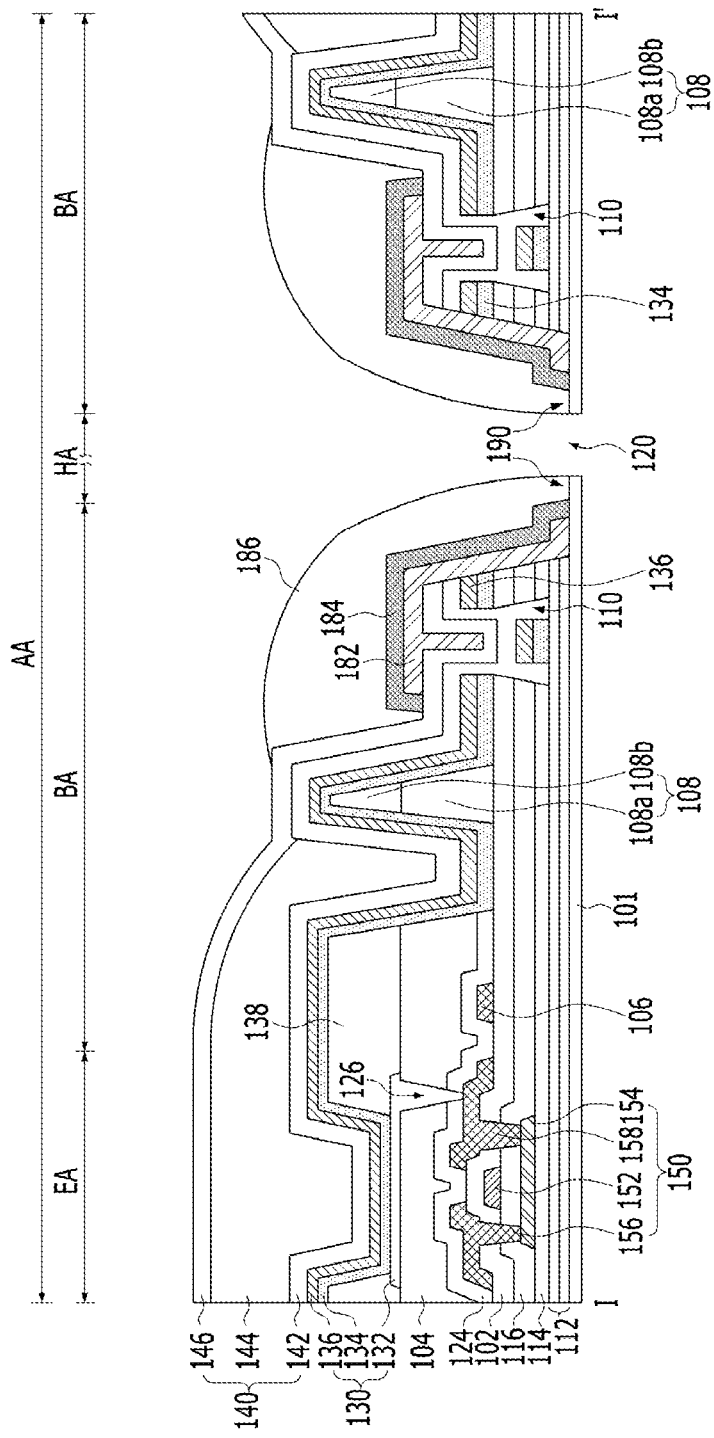
FIG. 9 is a cross-sectional view illustrating an organic light emitting display device having a substrate hole according to a fourth embodiment of the present disclosure.

FIG. 9 is a cross-sectional view illustrating an organic light emitting display device according to a fourth embodiment of the present disclosure.

The organic light emitting display device illustrated in FIG. 9 includes the same constituent elements as those of the organic light emitting display device illustrated in FIG. 5, except that a side cover layer 186 is further included. Accordingly, no detailed description will be given of the same constituent elements.

The side cover layer 186 is formed to cover outer side surfaces of the moisture penetration preventing layer 182 and the black layer 184. The side cover layer 186 is made of a frit-based sealant. The side cover layer 186 made of the frit-based sealant exhibits high bonding force to a thin film layer disposed adjacent thereto and, as such, may prevent penetration of external moisture or oxygen into the outer side surface and interface of the light emitting stack 134. The side cover layer 186, which is disposed to cover the outer side surface of the light emitting stack 134, lengthens a moisture penetration path, thereby preventing degradation of the light emitting stack 134.

FIGS. 10A to 10D are cross-sectional views explaining a method for manufacturing the organic light emitting display device illustrated in FIG. 9 according to an embodiment of the present disclosure.

Figure 10A:
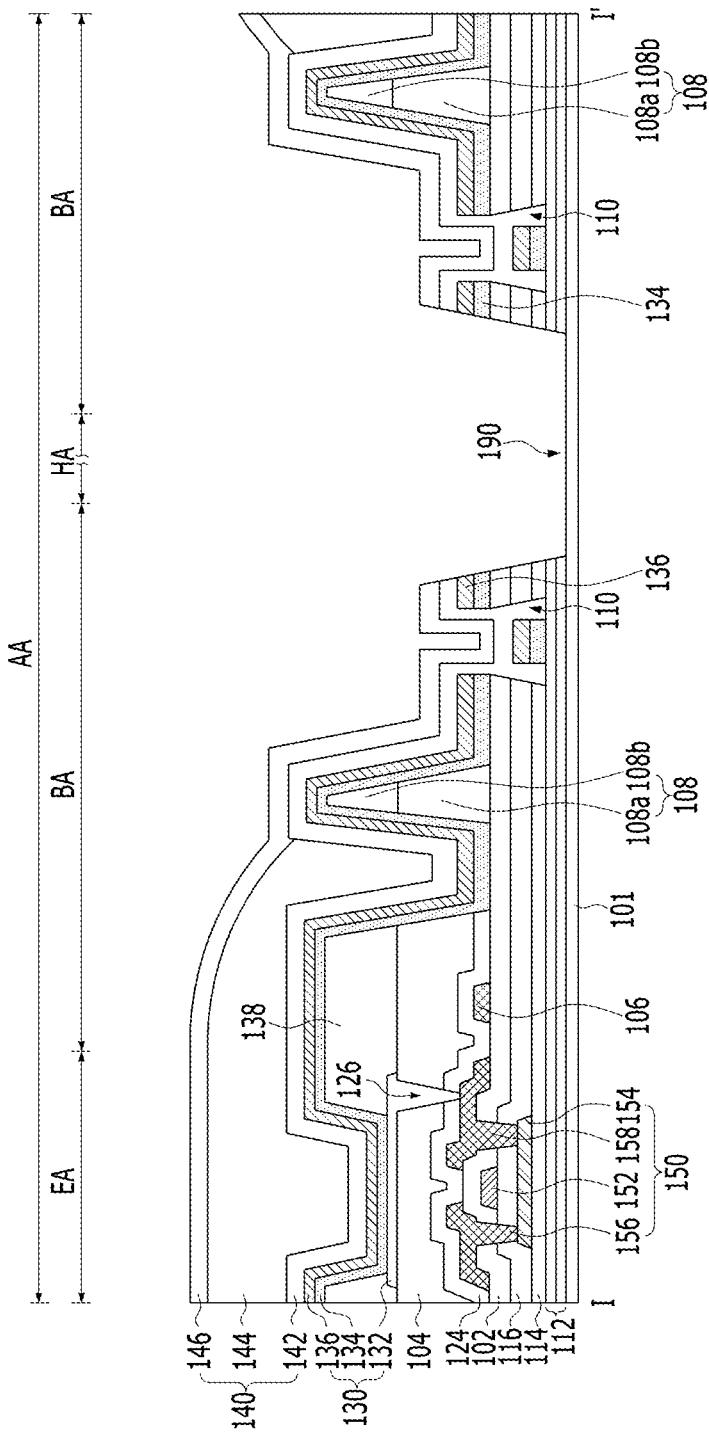
FIGS. 10A to 10D are cross-sectional views explaining a method for manufacturing the organic light emitting display device having the substrate hole illustrated in FIG. 9 according to an embodiment of the present disclosure.
Figure 10B:
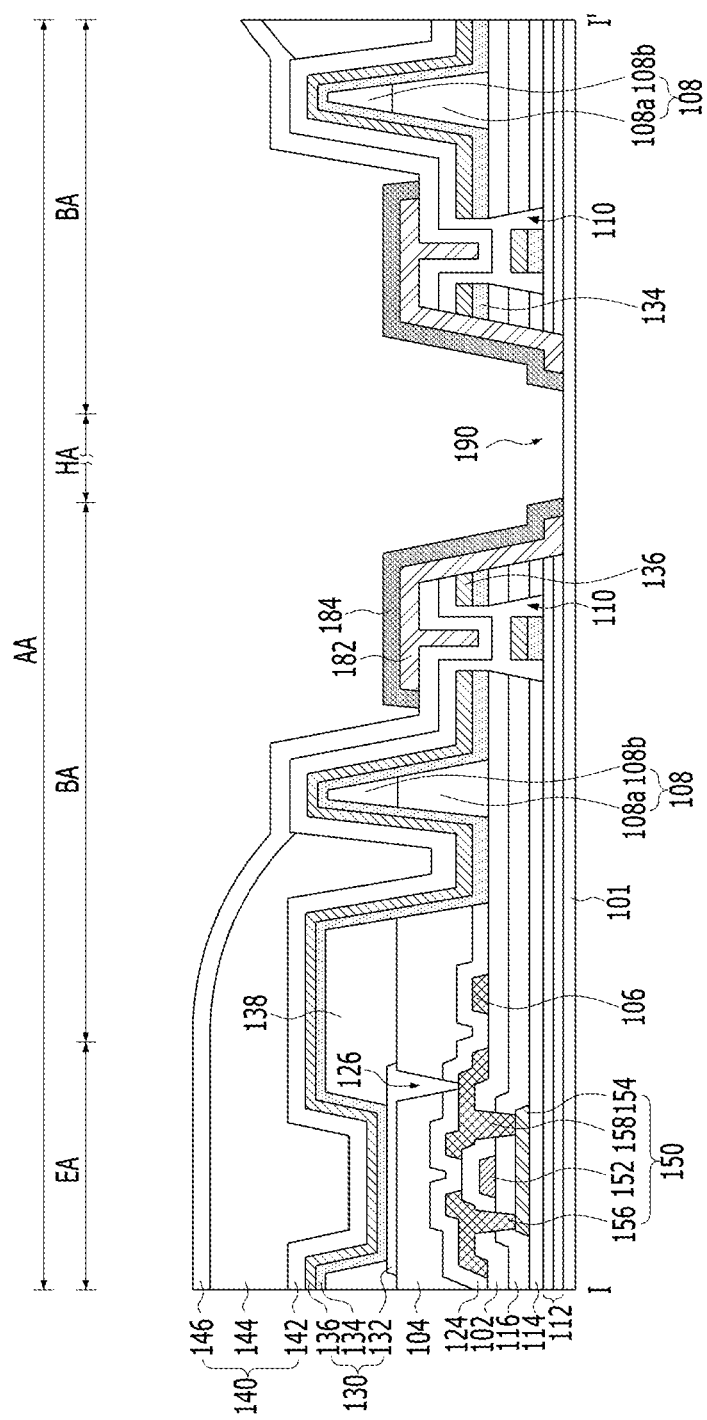
Figure 10C:
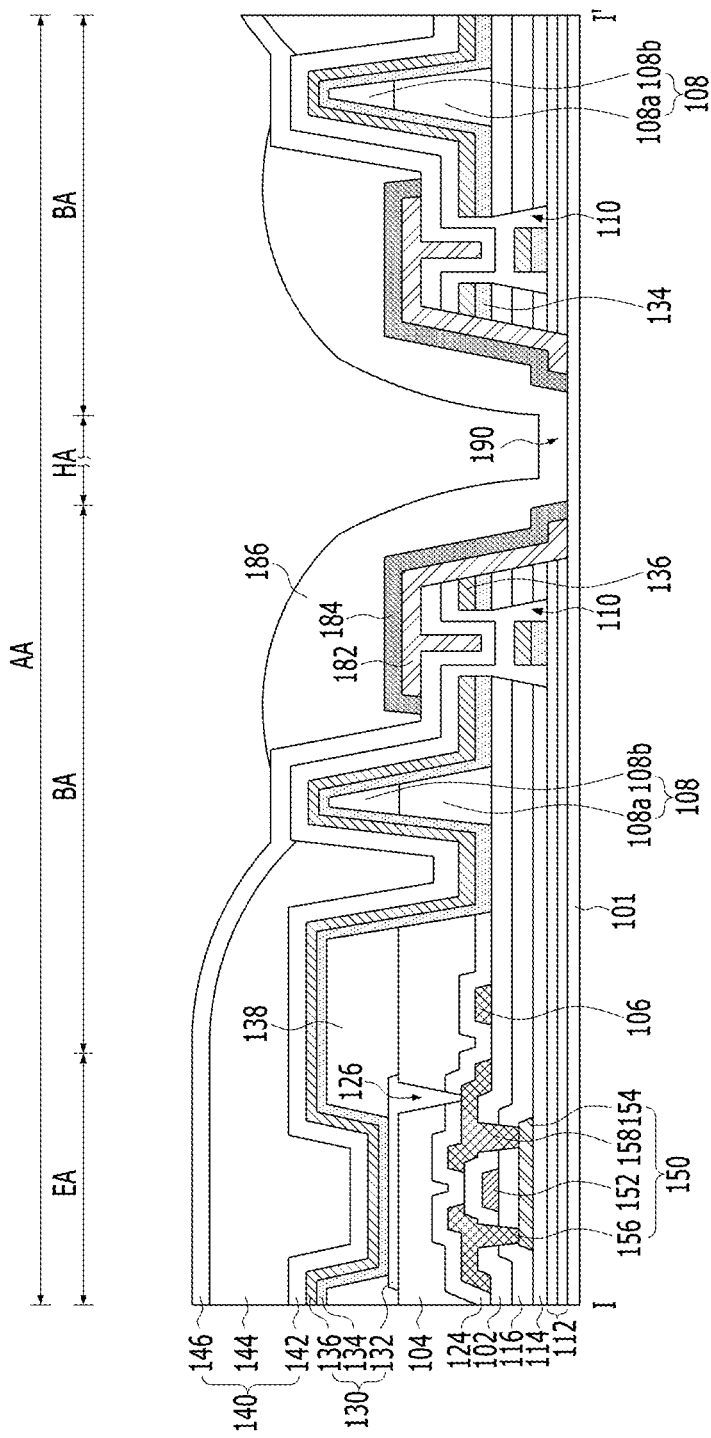
Figure 10D:
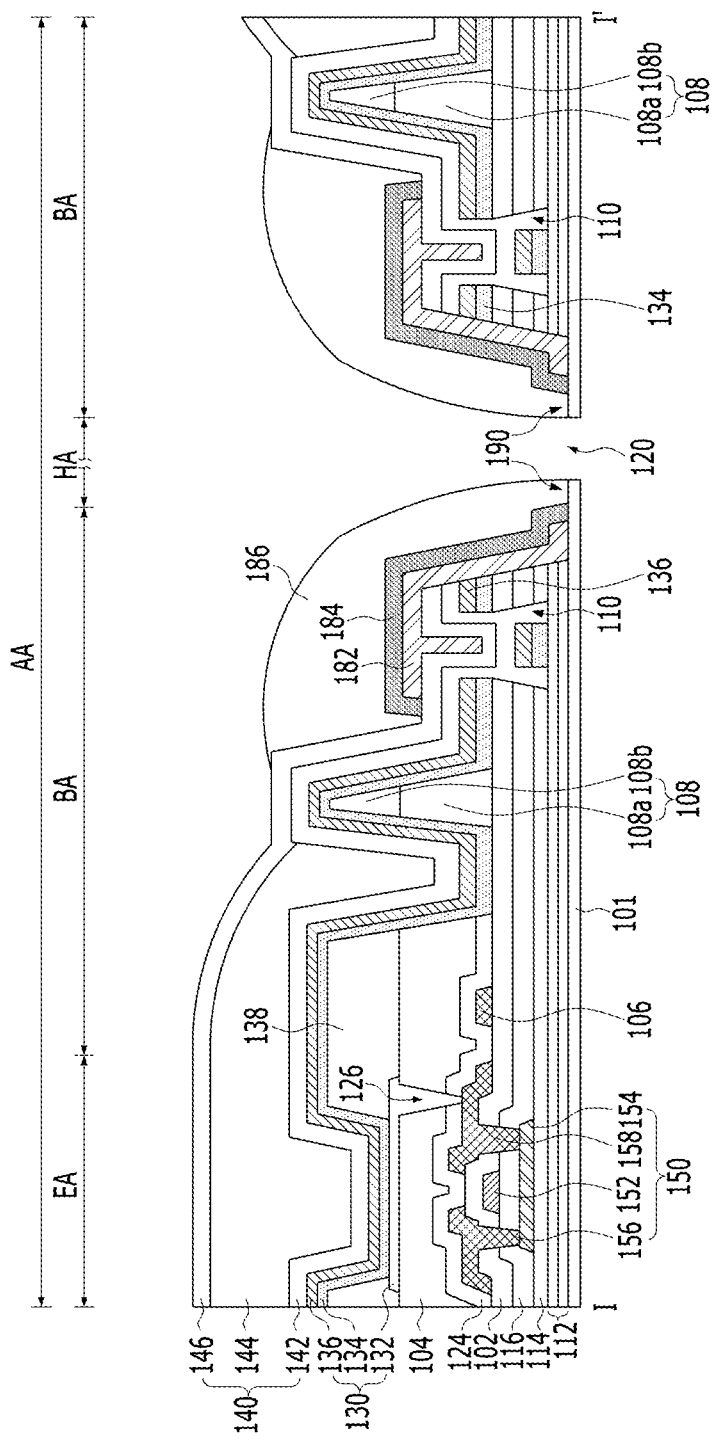

First, as illustrated in FIG. 10A, thin film transistors designated by reference numeral "150", the blocking groove 110, the light emitting elements 130, the encapsulation units 140 and the through hole 190 are formed in accordance with the manufacturing method illustrated in FIGS. 8A and 8B. Thereafter, the moisture penetration preventing layer 182 and the black layer 184 are sequentially formed in the barrier area BA, as illustrated in FIG. 10B. Subsequently, a frit-based sealant is coated to cover the black layer 184, and is then cured, thereby forming the side cover layer 186, as illustrated in FIG. 10C. Portions of the substrate 101 and the side cover layer 186 disposed in the hole area HA are then removed through a laser trimming process, thereby forming the substrate hole 120, as illustrated in FIG. 10D. During the laser trimming process, the side cover layer 186 may be melted and then re-sintered to cover the outer side surface of the substrate 101 exposed through the substrate hole 120.

As such, in the present disclosure, the outer side surface of the light emitting stack 134 is sealed by the moisture penetration preventing layer 182, the black layer 184 and the side cover layer 186. Accordingly, it may be possible to prevent external moisture or oxygen from penetrating into the interface of the light emitting stack 134, thereby preventing degradation of the light emitting stack.

Figure 11:
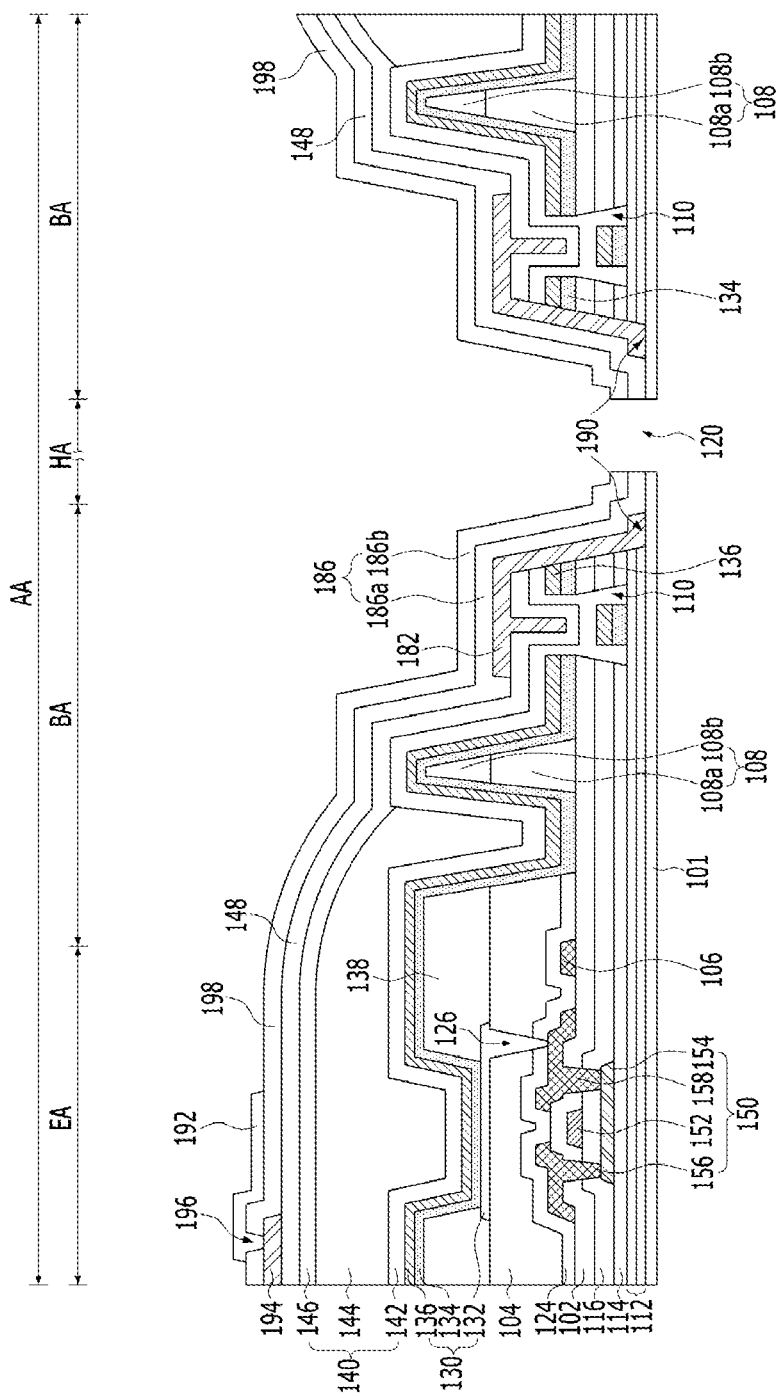
FIG. 11 is a cross-sectional view illustrating an organic light emitting display device having a substrate hole according to a fifth embodiment of the present disclosure.

FIG. 11 is a cross-sectional view illustrating an organic light emitting display device according to a fifth embodiment of the present disclosure.

The organic light emitting display device illustrated in FIG. 11 includes the same constituent elements as those of the organic light emitting display device illustrated in FIG. 9, except that the side cover layer 186 extends from at least one of the touch insulating film 198 or the touch buffer film 148. Accordingly, no detailed description will be given of the same constituent elements.

The side cover layer 186 is formed to cover the outer side surface of the moisture penetration preventing layer 182. The side cover layer 186 extends from at least one of the touch insulating film 198 or the touch buffer film 148. For example, the side cover layer 186 includes first and second side cover layers 186a and 186b, which are sequentially laminated. The first side cover layer 186a extends from the touch buffer film 148, to cover the moisture penetration preventing layer 182. The second side cover layer 186b extends from the touch insulating film 198, to cover the first side cover layer 186a.

As such, it may be possible to prevent external moisture or oxygen from penetrating into the light emitting stack 134 by the moisture penetration preventing layer 182 and the side cover layer 186 overlapping with the outer side surface of the light emitting stack 134 and the blocking groove 110.

Meanwhile, although the black layer 184 is shown in FIG. 11 as being not disposed on the moisture penetration preventing layer 182, the black layer 184 as shown in FIG. 5 may be disposed on the moisture penetration preventing layer 182, to physically contact the moisture penetration preventing layer 182. In addition, the touch buffer film 148 and the touch insulating film 198 may be disposed between the black layer 184 and the moisture penetration preventing layer 182 such that the black layer 184 and the moisture penetration preventing layer 182 may not physically contact each other.

Figure 12A:
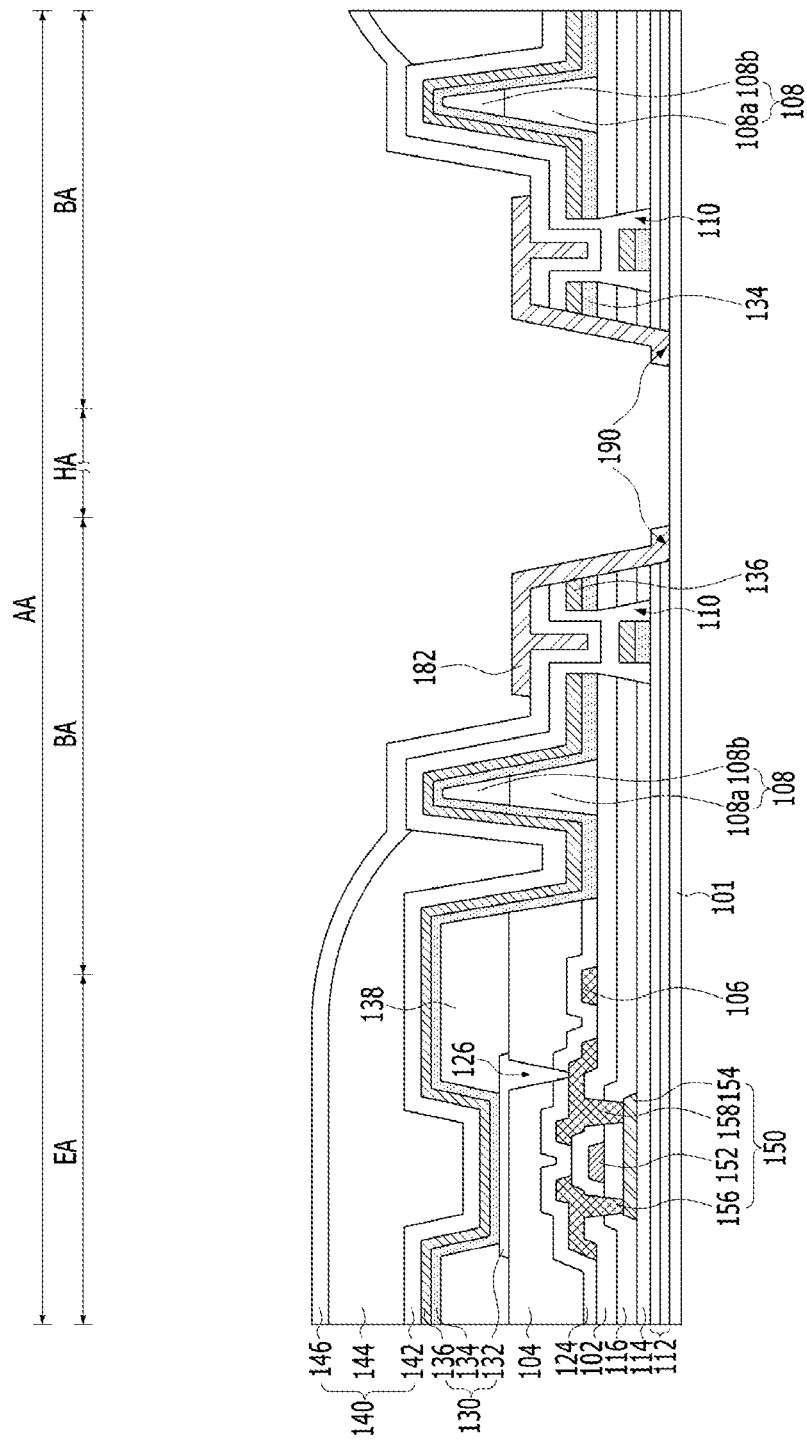
FIGS. 12A to 12C are cross-sectional views explaining a method for manufacturing the organic light emitting display device having the substrate hole illustrated in FIG. 11 according to an embodiment of the present disclosure.
Figure 12B:
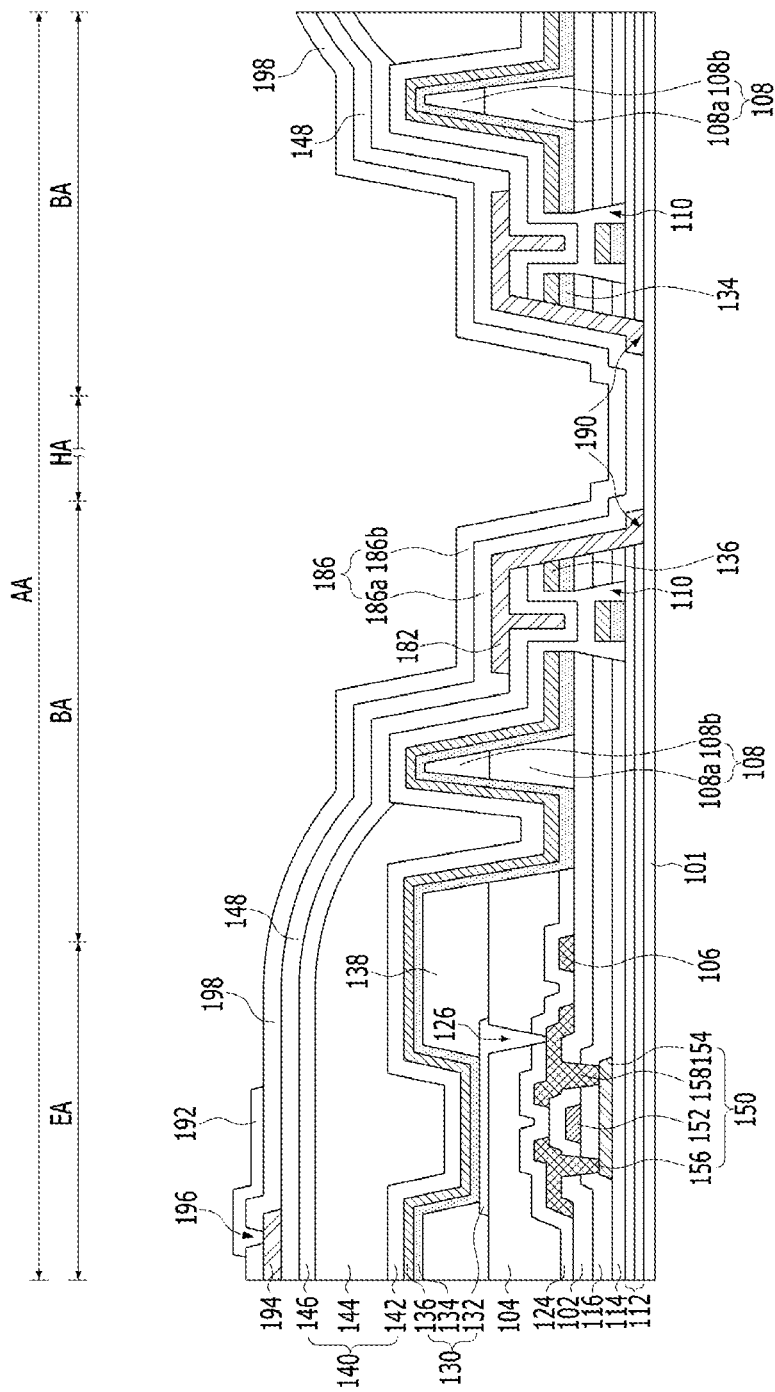
Figure 12C:
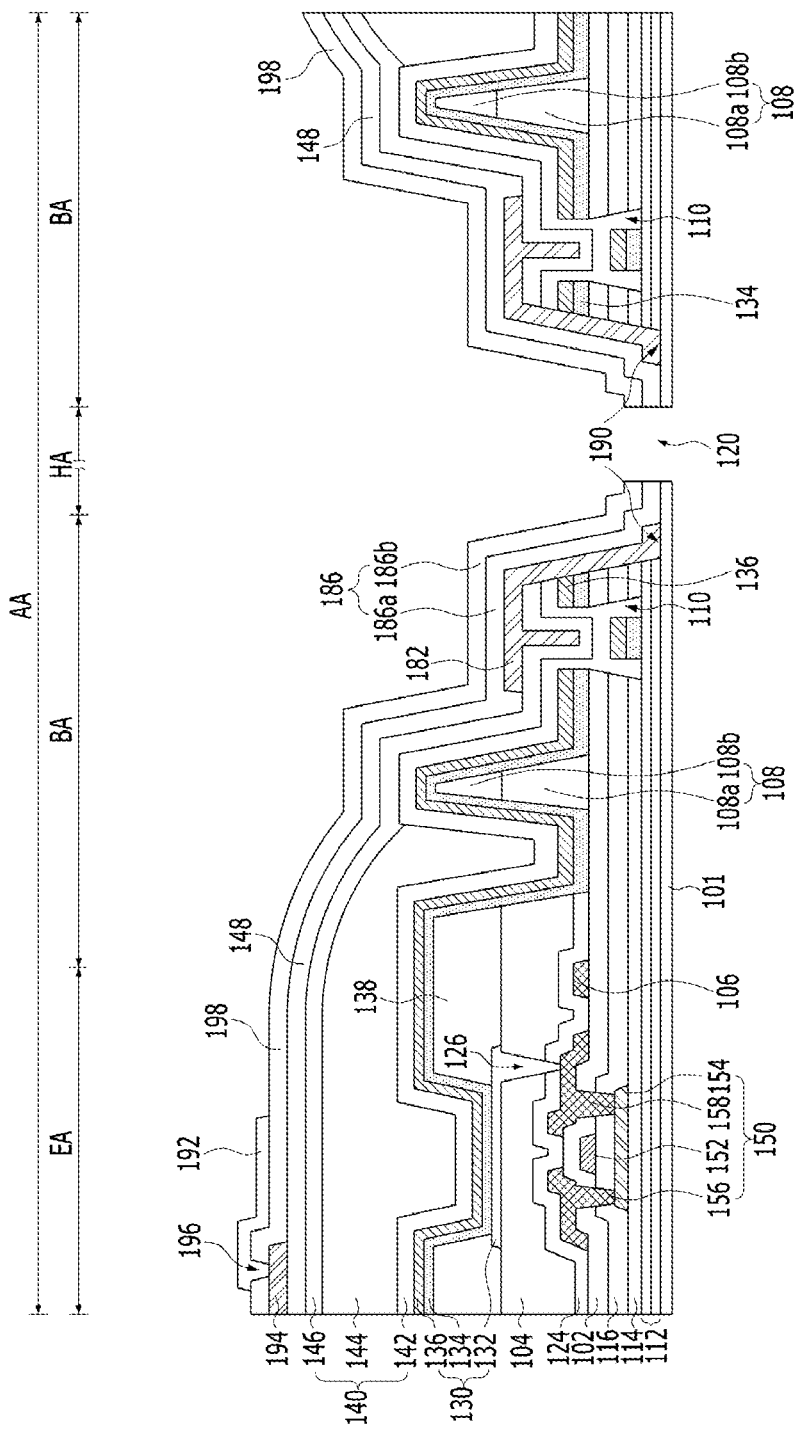

FIGS. 12A to 12C are cross-sectional views explaining a method for manufacturing the organic light emitting display device illustrated in FIG. 9 according to an embodiment of the present disclosure.

First, as illustrated in FIG. 12A, the thin film transistors 150, the blocking groove 110, the light emitting elements 130, the encapsulation units 140, and the through hole 190 are formed in accordance with the manufacturing method illustrated in FIGS. 8A and 8B. Thereafter, the moisture penetration preventing layer 182 is formed in the barrier area BA, and an inorganic or organic insulating material is coated over the entire upper surface of the resultant structure, thereby forming the touch buffer film 148 and the first side cover layer 186a, as illustrated in FIG. 12B. The bridges 194 are then formed on the substrate 101 formed with the touch buffer film 148 and the first side cover layer 186a through a photolithography process and an etching process. Subsequently, an inorganic or organic insulating material is coated over the entire upper surface of the substrate 101 formed with the bridges 194, thereby forming the touch insulating film 198 and the second side cover layer 186b. Thereafter, the touch insulating film 198 is patterned through a photolithography process and an etching process, thereby forming the touch contact holes 196. The touch electrodes 196 are then formed on the substrate 101 formed with the touch contact holes 196 through a photolithography process and an etching process. Next, portions of the first and second side cover layers 186a and 186b and the substrate 101 disposed in the hole area HA are removed through a laser trimming process, thereby forming the substrate hole 120, as illustrated in FIG. 12C.

As such, in the present disclosure, the outer side surface of the light emitting stack 134 is sealed by the moisture penetration preventing layer 182, the black layer 184, and the side cover layer 186, thereby preventing external moisture or oxygen from penetrating into the interface of the light emitting stack 134. Accordingly, degradation of the light emitting stack 134 may be prevented.

As apparent from the above description, the present disclosure provides the following effects.

As the camera module is disposed within the active area in accordance with the present disclosure, it may be possible to minimize the bezel area, which is a non-display area of the display device.

In addition, in accordance with the present disclosure, the moisture penetration preventing layer is disposed to overlap with the light emitting stack disposed between the substrate hole and the inner dam and, as such, it may be possible to prevent external moisture or oxygen from penetrating into the active area.

Furthermore, in accordance with the present disclosure, the black layer is disposed on the moisture penetration preventing layer and, as such, it may be possible to prevent externally incident light from being reflected by the moisture penetration preventing layer. Accordingly, an enhancement in visibility may be achieved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a plurality of light emitting elements disposed on a substrate, each of the light emitting elements comprising a respective light emitting stack;
a substrate hole passing through the substrate while being surrounded by the light emitting elements;
an inner dam disposed between the substrate hole and the light emitting elements; and
a moisture penetration preventing layer disposed only between the inner dam and the substrate hole while covering an outer side surface of the light emitting stacks.

2. The display device according to claim 1, further comprising:
a blocking groove disposed between the inner dam and the substrate hole while overlapping with the moisture penetration preventing layer, the blocking groove having a reversed taper shape.

3. The display device according to claim 1, further comprising:
a through hole disposed to surround the substrate hole while passing through the light emitting stacks,
wherein the moisture penetration preventing layer is disposed on side surfaces of the light emitting stacks exposed through the through hole.

4. The display device according to claim 1, further comprising:
a black layer disposed to cover upper and side surfaces of the moisture penetration preventing layer.

5. The display device according to claim 1, wherein the moisture penetration preventing layer is formed to have a single-layer structure or a multilayer structure, using at least one of W, Mo, Co, Ag, Al, Cu, MoTi, Ta, or Ti.

6. The display device according to claim 1, further comprising:
a side cover layer made of a frit-based sealant, the side cover layer covering the moisture penetration preventing layer.

7. The display device according to claim 1, further comprising:
an encapsulation unit disposed on the light emitting elements; and
a touch sensor disposed on the encapsulation unit, the touch sensor comprising a touch electrode and a bridge.

8. The display device according to claim 7, wherein the moisture penetration preventing layer is made of the same material as at least one of the touch electrode or the bridge, and is disposed on a same plane as the at least one of the touch electrode or the bridge.

9. The display device according to claim 7, further comprising:
a touch buffer film disposed between the touch sensor and the encapsulation unit; and
a touch insulating film disposed between the touch electrode and the bridge.

10. The display device according to claim 9, further comprising:
a side cover layer disposed on the moisture penetration preventing layer while extending from at least one of the touch buffer film or the touch insulating film.

11. The display device according to claim 9, further comprising:
a bank disposed without covering anode electrodes of the light emitting elements such that the anode electrodes are exposed;
a black matrix disposed over the touch sensor while overlapping with the bank; and
a black layer disposed on upper and side surfaces of the moisture penetration preventing layer.

12. The display device according to claim 11, wherein the black layer is made of the same material as the black matrix.

13. The display device according to claim 11, wherein the black layer contacts the moisture penetration preventing layer.

14. The display device according to claim 11, wherein at least one of the touch insulating film or the touch buffer film is disposed between the black layer and the moisture penetration preventing layer.

15. The display device according to claim 1, further comprising:
a camera module disposed within the substrate hole.

16. The display device according to claim 1, wherein the moisture penetration preventing layer covers the outer side surface of the light emitting stacks exposed through the substrate hole.

* * * * *